United States Patent
Sekiya et al.

(10) Patent No.: US 11,614,687 B2
(45) Date of Patent: Mar. 28, 2023

(54) IMAGE FORMING APPARATUS AND IMAGE FORMING METHOD

(71) Applicant: CANON KABUSHIKI KAISHA, Tokyo (JP)

(72) Inventors: Michiyo Sekiya, Shizuoka (JP); Kazunori Noguchi, Shizuoka (JP); Daisuke Yoshiba, Shizuoka (JP)

(73) Assignee: Canon Kabushiki Kaisha, Tokyo (JP)

(*) Notice: Subject to any disclaimer, the term of this patent is extended or adjusted under 35 U.S.C. 154(b) by 163 days.

(21) Appl. No.: 17/103,702

(22) Filed: Nov. 24, 2020

(65) Prior Publication Data

US 2021/0165321 A1    Jun. 3, 2021

(30) Foreign Application Priority Data

Nov. 29, 2019 (JP) .............................. JP2019-217519

(51) Int. Cl.
| | |
|---|---|
| *G03F 7/032* | (2006.01) |
| *G03F 7/031* | (2006.01) |
| *G03G 5/05* | (2006.01) |
| *G03G 9/087* | (2006.01) |
| *G03G 15/00* | (2006.01) |

(52) U.S. Cl.
CPC .............. *G03F 7/032* (2013.01); *G03F 7/031* (2013.01); *G03G 5/0507* (2013.01); *G03G 5/0564* (2013.01); *G03G 9/08782* (2013.01); *G03G 15/75* (2013.01)

(58) Field of Classification Search
CPC ....... G03F 7/032; G03F 7/031; G03G 5/0507; G03G 5/0564; G03G 9/08782; G03G 15/75
See application file for complete search history.

(56) References Cited

U.S. PATENT DOCUMENTS

| | | | |
|---|---|---|---|
| 10,503,089 B2* | 12/2019 | Masuda | G03G 9/08782 |
| 2005/0058927 A1 | 3/2005 | Mikuriya et al. | |
| 2016/0124328 A1 | 5/2016 | Kawahara et al. | |
| 2017/0090310 A1 | 3/2017 | Katsuhara et al. | |
| 2021/0165337 A1* | 6/2021 | Sekiya | G03G 5/0631 |
| 2021/0165364 A1* | 6/2021 | Kinumatsu | G03G 5/0564 |
| 2021/0200109 A1* | 7/2021 | Yoshiba | G03G 9/0819 |

FOREIGN PATENT DOCUMENTS

| | | |
|---|---|---|
| EP | 2977818 A1 | 1/2016 |
| JP | 2009122717 A | 6/2009 |
| JP | 2009300567 A * | 12/2009 |

(Continued)

*Primary Examiner* — Ryan D Walsh
(74) *Attorney, Agent, or Firm* — Canon U.S.A., Inc., IP Division

(57) ABSTRACT

An image forming apparatus including an electrophotographic photosensitive member having a support and a photosensitive layer, a charging unit that forms an electrostatic image on an outer surface of the electrophotographic photosensitive member, a developing unit that supplies a toner to the electrostatic image to form a toner image, and a transfer unit that transfers the toner image on a transfer medium. In this image forming apparatus, the surface layer of the electrophotographic photosensitive member contains a binder resin (A) having a specific structure and silica particles, and the wax contains a specific monoester compound.

14 Claims, 1 Drawing Sheet

(56) References Cited

FOREIGN PATENT DOCUMENTS

| | | |
|---|---|---|
| JP | 2011248249 A | 12/2011 |
| JP | 2015141235 A | 8/2015 |
| JP | 2015169800 A | 9/2015 |
| JP | 2015175877 A | 10/2015 |
| JP | 2017097161 A | 6/2017 |
| JP | 2017125879 A | 7/2017 |
| JP | 6250637 B2 | 12/2017 |
| JP | 2018013589 A | 1/2018 |
| JP | 2019095679 A | 6/2019 |
| WO | 2014157424 A1 | 10/2014 |

* cited by examiner

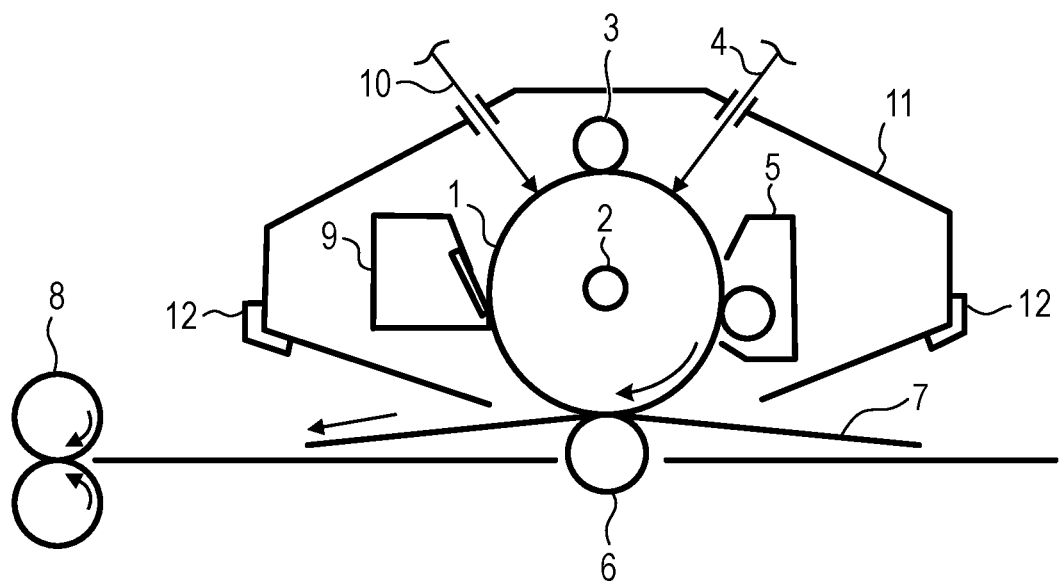

IMAGE FORMING APPARATUS AND IMAGE FORMING METHOD

BACKGROUND OF THE INVENTION

Field of the Invention

The present disclosure relates to an image forming apparatus having an electrophotographic photosensitive member and a toner and an image forming method.

Description of the Related Art

In recent years, an image forming apparatus having an electrophotographic photosensitive member and a toner has been widely studied in order to improve image quality and durability. Furthermore, studies have been made to lower a fixing temperature in order to save energy. In order to perform fixing at a low temperature, it has been necessary to lower a melting point of the toner and at the same time to improve offset resistance by adding wax to the toner.

Japanese Patent No. 6250637 describes a toner containing a monoester compound for the purpose of improving low-temperature fixability.

Japanese Patent Application Laid-Open No. 2015-169800 describes an electrophotographic photosensitive member having a surface layer containing silica particles and a specific polycarbonate resin for the purpose of improving wear resistance and oil crack resistance.

According to the study by the present inventors, it has been found that when an image is formed in a high temperature and high humidity environment using an image forming apparatus using the electrophotographic photosensitive member described in Japanese Patent Application Laid-Open No. 2015-169800 and the toner described in Japanese Patent No. 6250637, a sufficient image quality cannot be obtained and an image flow may occur.

SUMMARY OF THE INVENTION

Therefore, an aspect of the present disclosure is to provide an image forming apparatus, which has high durability and good low-temperature fixability and further suppresses the occurrence of image flow in a high temperature and high humidity environment, and an image forming method.

The above aspect is achieved by the following disclosure. That is, the image forming apparatus according to the present disclosure is an image forming apparatus including an electrophotographic photosensitive member having a support and a photosensitive layer, a charging unit that forms an electrostatic image on an outer surface of the electrophotographic photosensitive member, a developing unit that supplies a toner to the electrostatic image to form a toner image, and a transfer unit that transfers the toner image on a transfer medium. In this image forming apparatus, a surface layer of the electrophotographic photosensitive member contains a binder resin (A) and silica particles, and the binder resin (A) has a structure represented by the following formula (1) and a structure represented by the formula (2):

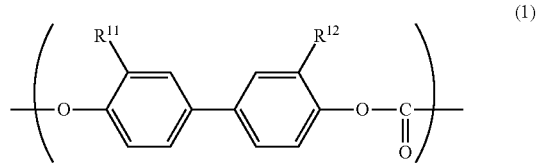

(In formula (1), $R^{11}$ and $R^{12}$ each independently represent a hydrogen atom or a methyl group.)

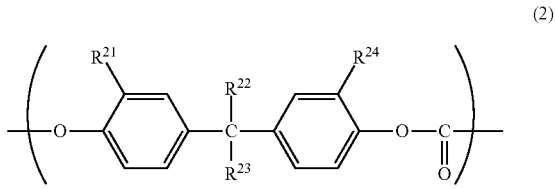

(In formula (2), $R^{21}$ and $R^{24}$ each independently represent a hydrogen atom or a methyl group. $R^{22}$ and $R^{23}$ each independently represent a hydrogen atom, a methyl group, an ethyl group or a phenyl group, or $R^{22}$ and $R^{23}$ combine with each other to form a cycloalkylidene group.)

The toner has toner particles, the toner particles contain a binder resin (B) and a wax, and the wax contains a monoester compound represented by the following formula (3):

$$R^{31}\text{—COO—}R^{32} \quad (3)$$

(In formula (3), $R^{31}$ and $R^{32}$ each independently represent an alkyl group having 10 to 30 carbon atoms.)

Further features of the present disclosure will become apparent from the following description of exemplary embodiments with reference to the attached drawing.

BRIEF DESCRIPTION OF THE DRAWINGS

FIGURE is a diagram showing an example of a schematic configuration of an electrophotographic apparatus according to the present disclosure.

DESCRIPTION OF THE EMBODIMENTS

Hereinafter, with reference to preferable embodiments, the present disclosure will be described in detail.

In the image forming apparatus in which the electrophotographic photosensitive member described in Japanese Patent Application Laid-Open No. 2015-169800 and the toner described in Japanese Patent No. 6250637 are combined, when an image is formed in a high temperature and high humidity environment, an image flow occurs. The reason for this is presumed as follows.

In the electrophotographic photosensitive member described in Japanese Patent Application Laid-Open No. 2015-169800 containing a specific binder resin, a surface of the electrophotographic photosensitive member is less likely to be scratched as the wear resistance is improved, and as a result, a charged product accumulated on the surface of the electrophotographic photosensitive member increases. On the other hand, the toner described in Japanese Patent No. 6250637, which contains a monoester compound for the purpose of improving low-temperature fixability, has a property that the monoester compound is likely to exude onto a toner surface in a high temperature and high humidity environment. Thus, in a case of using both this toner and the electrophotographic photosensitive member whose surface is less likely to be scratched, when a force is applied to the toner between the electrophotographic photosensitive member and the development roller, the monoester compound exudes. It is considered that the exuded monoester compound adheres to the surfaces of the development roller and the electrophotographic photosensitive member, as a result, a rubbing effect between the surface of the electrophotographic photosensitive member and the toner during development is reduced, and the charged product is not sufficiently scraped off.

As a result of various studies by the present inventors on means capable of sufficiently obtaining an effect of scraping off the charged product on the surface of the electrophotographic photosensitive member while achieving both the wear resistance of the electrophotographic photosensitive member and the low-temperature fixability of the toner, they have reached the structure of the present disclosure.

An electrophotographic apparatus according to the present disclosure has an electrophotographic photosensitive member having a support and a photosensitive layer, a charging unit that forms an electrostatic image on an outer surface of the electrophotographic photosensitive member, a developing unit that supplies a toner to the electrostatic image to form a toner image, and a transfer unit that transfers the toner image to a transfer medium. A surface layer of the electrophotographic photosensitive member contains a binder resin (A) and silica particles, and the binder resin (A) has a structure represented by the following formula (1) and a structure represented by the following formula (2).

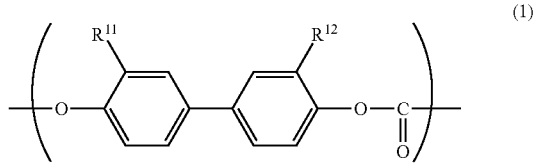

(In formula (1), $R^{11}$ and $R^{12}$ each independently represent a hydrogen atom or a methyl group.)

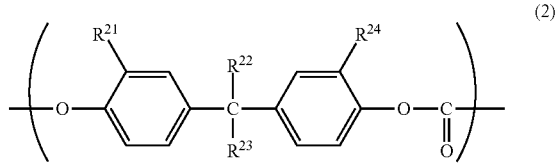

(In formula (2), $R^{21}$ and $R^{24}$ each independently represent a hydrogen atom or a methyl group.

$R^{22}$ and $R^{23}$ each independently represent a hydrogen atom, a methyl group, an ethyl group or a phenyl group, or $R^{22}$ and $R^{23}$ combine with each other to form a cycloalkylidene group.)

Examples of cycloalkylidene groups formed by bonding $R^{22}$ and $R^{23}$ to each other in the structure represented by the formula (2) include cyclopropylidene group, cyclobutylidene group, cyclopentylidene group, cyclohexylidene group, cycloheptilidene group and cyclooctylidene group.

The toner has toner particles, the toner particles contain a binder resin (B) and a wax, and the wax contains a monoester compound represented by the following formula (3):

(In formula (3), $R^{31}$ and $R^{32}$ each independently represent an alkyl group having 10 to 30 carbon atoms.)

In the present disclosure, since the surface layer contains the binder resin (A) and silica particles, a suitable convex shape is formed on the surface of the electrophotographic photosensitive member. Thus, it is considered that the rubbing effect can be obtained even if the monoester compound exuded from the toner is present on the surface of the electrophotographic photosensitive member, and the charged product can be scraped off.

In addition, when the wax contains the monoester compound represented by the formula (3), it becomes easy to control a presence state of the wax in the toner. The monoester compound represented by the formula (3) has a suitable compatibility with the binder resin (B), and it is easy to achieve both low-temperature fixability and toner storage stability.

When a ratio of the value of the content ratio of silica particles, based on mass, to the binder resin (A) in the surface layer of the electrophotographic photosensitive member is defined as "a", and the value of the content ratio of the monoester compound represented by the formula (3), based on mass, to the binder resin (B) in the toner particles is defined as "b", a:B is preferably in a range of 0.01:1 to 0.5:1. When this ratio is out of the range of 0.01:1 to 0.5:1, the influence of exudation of the monoester compound represented by the formula (3) is large, and the effect of scraping off the charged product by the silica particles may not be sufficient.

[Toner]

Hereinafter, the toner used in the present disclosure will be further described.

The toner used in the image forming apparatus according to the present disclosure has toner particles, the toner particles contain the binder resin (B) and a wax, and the wax contains the monoester compound represented by the formula (3).

The monoester compound represented by the formula (3) will be described below.

The number of carbon atoms of the alkyl group represented by $R^{31}$ and $R^{32}$ in the formula (3) is preferably 10 to 30, more preferably 15 to 25, and further preferably 18 to 22.

The number of carbon atoms per molecule of the monoester compound represented by the formula (3) is preferably 36 to 44.

Examples of aliphatic alcohols forming the monoester compound represented by the formula (3) include 1-hexanol, 1-heptanol, 1-octanol, 1-nonanol, 1-decanol, undecyl alcohol, lauryl alcohol, myristyl alcohol, 1-hexadecanol, stearyl alcohol, arachidyl alcohol, behenyl alcohol, and lignoceryl alcohol. Examples of aliphatic carboxylic acids include pentanic acid, hexanoic acid, heptanic acid, octanoic acid, nonanoic acid, decanoic acid, lauric acid, myristic acid, palmitic acid, stearic acid, arachidic acid, behenic acid, and lignoceric acid.

Specific examples of the monoester compound represented by the formula (3) include behenyl stearate ($C_{17}H_{35}$—COO—$C_{22}H_{45}$), eicosyl eicosanoate ($C_{19}H_{39}$—COO—$C_{20}H_{41}$), stearyl behenate ($C_{21}H_{43}$—COO—$C_{18}H_{37}$), and hexadecyl lignocerate ($C_{23}H_{47}$—COO—$C_{16}H_{33}$). Of these, behenyl stearate and stearyl behenate are preferred as the monoester compound represented by the formula (3).

A melting point of the monoester compound represented by the formula (3) is preferably 60° C. or higher and 75° C. or lower, and more preferably 65° C. or higher and 75° C. or lower. When the melting point is 60° C. or higher and 75° C. or lower, it becomes easy to achieve both the storage stability and low-temperature fixability of the toner.

The wax contains a monoester wax, and if the monoester wax is mainly composed of the monoester compound represented by the formula (3), the effect of the present disclosure can be obtained. A ratio of the monoester wax in the wax contained in the toner particles is preferably 95% by mass or more. The monoester wax preferably contains 95% by mass or more of the monoester compound represented by the formula (3).

An acid value of the monoester compound represented by the formula (3) is preferably 1.0 mgKOH/g or less, more preferably 0.6 mgKOH/g or less, and further preferably 0.3 mgKOH/g or less. If the acid value is greater than 1.0 mgKOH/g, storability of the toner may deteriorate.

The content of the monoester compound represented by the formula (3) contained in the toner particles is preferably 10 to 30 parts by mass with respect to 100 parts by mass of the binder resin (B). When the content is 10 parts by mass or more, the effect of the present disclosure can be stably obtained. When the content is 30 parts by mass or less, the storage stability is improved.

In the present disclosure, other waxes may be used in addition to the monoester compound represented by the formula (3).

Specific examples thereof include aliphatic hydrocarbon such as a low molecular weight polyethylene, a low molecular weight polypropylene, a microcrystalline wax, a paraffin wax, and a Fischer-Tropsch wax, and polyfunctional ester wax. Examples of the polyfunctional ester wax include pentaerythritol ester compounds such as pentaerythritol tetrapalmitate, pentaerythritol tetrabehenate and pentaerythritol tetrastearate; glycerin ester compounds such as hexaglycerin tetrabehenate tetrapalmitate, hexaglycerin octabehenate, pentaglycerin heptabehenate, tetraglycerin hexabehenate, triglycerin pentabehenate, diglycerin tetrabehenate and glycerin tribehenate; and dipentaerythritol ester compounds such as dipentaerythritol hexamyristate and dipentaerythritol hexapalmitate.

A process for producing the monoester compound represented by the formula (3) is not particularly limited, and examples thereof include the following processes: a method of synthesis by an oxidation reaction, synthesis from carboxylic acid and derivatives thereof, ester group introducing reactions as typified by the Michael addition reaction, a method using a dehydration condensation reaction from a carboxylic acid compound and an alcohol compound, a reaction from an acid halide and an alcohol compound, and an ester-exchange reaction. In these production processes, a catalyst can be appropriately used. As the catalyst, a general acidic or alkaline catalyst used in the esterification reaction, such as zinc acetate or a titanium compound, are preferred. After the esterification reaction, the target product can be purified by recrystallization, distillation, etc.

A specific production example of the monoester compound represented by the formula (3) is shown below.

First, alcohol and carboxylic acid being starting materials are added to a reactor. Alcohol and carboxylic acid are mixed so that a molar ratio of alcohol and carboxylic acid is 1:1. In consideration of reactivity in a dehydration condensation reaction or the like, one of the alcohol and carboxylic acid may be added in slightly higher ratio than the above-mentioned ratio.

Next, thus obtained mixture is appropriately heated to perform a dehydration condensation reaction. To the esterified crude product obtained by the dehydration condensation reaction, a basic aqueous solution and an organic solvent as needed are added, and unreacted alcohol and carboxylic acid are deprotonated to separate water phase. Then, by appropriately performing washing with water, distilling of solvent and filtration, the monoester wax represented by the formula (3) can be obtained.

The binder resin (B) is not particularly limited, and a known resin for toner can be used. Specific examples include vinyl resin, styrene resin, styrene copolymer resin, polyester resin, polyol resin, polyvinyl chloride resin, phenol resin, naturally modified phenol resin, natural resin modified maleic acid resin, acrylic resin, methacrylic resin, polyvinyl acetate, silicone resin, polyurethane resin, polyamide resin, furan resin, epoxy resin, xylene resin, polyvinyl butyral, terpene resin, coumarone-indene resin, and petroleum resin. Among these preferably used are styrenic copolymerized resins, polyester resins and hybrid resins obtained by mixing or partially reacting a polyester resin and a vinyl resin.

Of these, a vinyl resin is preferably used, and a styrene copolymerized resin is more preferred, from the viewpoint of compatibility with the monoester compound represented by the formula (3).

As long as the toner uses the monoester compound represented by the formula (3), there is no particular limitation on the production process. The toner can be produced by a method of producing toner particles in an aqueous medium, such as a grinding method, a dispersion polymerization method, an association aggregation method, a dissolution suspension method, a suspension polymerization method, or an emulsion aggregation method.

From the viewpoint of controlling the presence state of the monoester wax represented by the formula (3), the method of producing toner particles in an aqueous medium is preferred, and from the viewpoint of controlling the shape of the toner, the toner is preferably produced particularly by the suspension polymerization method.

The suspension polymerization method will be described below.

In the suspension polymerization method, a polymerizable monomer(s) and a colorant (and further optionally a polymerization initiator, a crosslinking agent, a charge control agent and other additives) are uniformly dissolved or dispersed to obtain a polymerizable monomer composition. Thereafter, the polymerizable monomer composition is dispersed into a continuous phase (e.g., a water phase) containing a dispersant by means of a suitable stirrer to simultaneously carry out polymerization reaction to obtain toner having desired particle sizes. In the toner (hereinafter also referred to as "polymerized toner") obtained by this suspension polymerization method, the individual toner particles stand uniform in a substantially spherical shape; therefore, charge quantity distribution becomes uniform, and image quality is improved.

In the production of the polymerized toner, examples of the polymerizable monomer constituting the polymerizable monomer composition include the following.

It is preferable to use a monovinyl monomer as the main component of the polymerizable monomer. Examples of the monovinyl monomer include: styrene; styrene derivatives such as vinyl toluene and α-methylstyrene; acrylic acid and methacrylic acid; acrylic acid esters such as methyl acrylate, ethyl acrylate, propyl acrylate, butyl acrylate, 2-ethylhexyl acrylate and dimethylaminoethyl acrylate; methacrylic acid esters such as methyl methacrylate, ethyl methacrylate, propyl methacrylate, butyl methacrylate, 2-ethylhexyl methacrylate and dimethylaminoethyl methacrylate; nitrile compounds such as acrylonitrile and methacrylonitrile; amide compounds such as acrylamide and methacrylamide; and olefins such as ethylene, propylene and butylene.

These monovinyl monomers can be used alone or in combination of two or more kinds. Among them, styrene, styrene derivatives, and acrylic acid esters or methacrylic acid esters are suitably used for the monovinyl monomer.

Examples of polymerization initiators used in the production of toner by the polymerization method include: persulfates such as potassium persulfate and ammonium persulfate; azo compounds such as 4,4'-azobis(4-cyanovaleric acid), 2,2'-azobis(2-methyl-N-(2-hydroxyethyl)propionamide), 2,2'-azobis(2-amidinopropane)dihydrochloride, 2,2'-azobis(2,4-dimethylvaleronitrile) and 2,2'-azobisisobutyronitrile; and organic peroxides such as di-t-butylperoxide, benzoylperoxide, t-butylperoxy-2-ethylhexanoate, t-butylperoxy diethyl acetate, t-hexylperoxy-2-ethylbutanoate, diisopropylperoxydicarbonate, di-t-butylperoxyisophthalate and t-butylperoxyisobutyrate. These polymerization initiators can be used alone or in combination of two or more kinds. Among them, the organic peroxides are preferably used since they can reduce residual polymerizable monomer and can impart excellent printing durability.

Among the organic peroxides, peroxy esters are preferred, and non-aromatic peroxy esters, i.e., peroxy esters having no aromatic ring are more preferred, since they have excellent initiator efficiency and can reduce a residual polymerizable monomer.

The polymerization initiator may be added after dispersing the polymerizable monomer composition to the aqueous medium and before forming droplets as described above, or may be added to the polymerizable monomer composition before the polymerizable monomer composition is dispersed in the aqueous medium.

The added amount of the polymerization initiator used in the polymerization of the polymerizable monomer composition is preferably 0.1 to 20 parts by mass, more preferably 0.3 to 15 parts by mass, particularly preferably 1 to 10 parts by mass, with respect to 100 parts by mass of the monovinyl monomer.

When the toner particles are produced by the polymerization method, a crosslinking agent may be added. The preferable added amount of the crosslinking agent is 0.001 to 15 parts by mass with respect to 100 parts by mass of the polymerizable monomer.

Here, a compound having two or more polymerizable double bonds is mainly used as the crosslinking agent. Examples of such a compound include: aromatic divinyl compounds such as divinyl benzene, divinyl naphthalene and derivatives thereof; ester compounds such as ethylene glycol dimethacrylate and diethylene glycol dimethacrylate, in which two or more carboxylic acids having a carbon-carbon double bond are esterified to alcohol having two or more hydroxyl groups; other divinyl compounds such as N,N-divinylaniline and divinyl ether; and compounds having three or more vinyl groups. These crosslinkable polymerizable monomers can be used alone or in combination of two or more kinds.

When a color toner is produced, black, cyan, yellow, and magenta colorants can be used.

As the black colorant, for example, carbon black, titanium black, and magnetic powders such as iron oxide zinc and iron oxide nickel can be used.

As the cyan colorant, for example, a copper phthalocyanine compound, a derivative thereof, an anthraquinone compound and the like can be used. Specific examples include C.I. Pigment Blue 2, 3, 6, 15, 15:1, 15:2, 15:3, 15:4, 16, 17:1, and 60.

As the yellow colorant, for example, compounds such as monoazo pigments, azo pigments such as disazo pigments, and condensed polycyclic pigments are used, and examples of the yellow colorant include C.I. Pigment Yellow 3, 12, 13, 14, 15, 17, 62, 65, 73, 74, 83, 93, 97, 120, 138, 155, 180, 181, 185, 186, and 213.

As the magenta colorant, for example, compounds such as monoazo pigments, azo pigments such as disazo pigments, and condensed polycyclic pigments are used, and examples of the magenta colorant include C.I. Pigment Red 31, 48, 57:1, 58, 60, 63, 64, 68, 81, 83, 87, 88, 89, 90, 112, 114, 122, 123, 144, 146, 149, 150, 163, 170, 184, 185, 187, 202, 206, 207, 209, 237, 238, 251, 254, 255, 269 and C.I. Pigment Violet 19.

These colorants can be used alone or in combination of two or more kinds. The amount of the colorant used in the production is preferably 1 to 10 parts by mass with respect to 100 parts by mass of the monovinyl monomer.

As other additives, a positively or negatively charged charge control agent can be used to improve chargeability of the toner.

The charge control agent is not particularly limited as long as it is generally used as a charge control agent for toner. Among the charge control agents, a positively or negatively charged charge control resin is preferred because it has high compatibility with the polymerizable monomer and can impart stable chargeability (charge stability) to the toner particles. In addition, from the viewpoint of obtaining a positively charged toner, a positively charged charge control resin is more preferably used.

Examples of the charge control agent having positively charging ability include a nigrosine dye, a quaternary ammonium salt, a triaminotriphenylmethane compound, an imidazole compound, a polyamine resin, a quaternary ammonium group-containing copolymer and a quaternary ammonium salt group-containing copolymer.

Examples of the charge control agent having negatively charging ability include: azo dyes containing metal such as Cr, Co, Al and Fe; metal salicylate compounds; metal alkylsalicylate compounds; and sulfonic acid group-containing copolymers, sulfonic acid base-containing copolymers, carboxylic acid group-containing copolymers and carboxylic acid base-containing copolymers.

The charge control agent can be used in the range of preferably 0.01 to 10 parts by mass, more preferably 0.03 to 8 parts by mass with respect to 100 parts by mass of the monovinyl monomer. If the amount of the charge control agent added is 0.01 parts by mass or more with respect to 100 parts by mass of the monovinyl monomer, occurrence of fog can be suppressed. On the other hand, if the amount of the charge control agent added is 10 parts by mass or less with respect to 100 parts by mass of the monovinyl monomer, occurrence of printing soiling can be suppressed.

As one of other additives, a molecular weight modifier is preferably used upon the polymerization of the polymerizable monomer.

The molecular weight modifier is not particularly limited as long as it is generally used as a molecular weight modifier for toner production. Examples of the molecular weight modifier include: mercaptans such as t-dodecyl mercaptan, n-dodecyl mercaptan, n-octyl mercaptan and 2,2,4,6,6-pentamethylheptane-4-thiol; and thiuram disulfides such as tetramethyl thiuram disulfide, tetraethyl thiuram disulfide, tetrabutyl thiuram disulfide, N,N'-dimethyl-N,N'-diphenyl thiuram disulfide and N,N'-dioctadecyl-N,N'-diisopropyl thiuram disulfide. These molecular weight modifiers may be used alone or in combination of two or more kinds.

The molecular weight modifier can be used in the range of preferably 0.01 to 10 parts by mass, more preferably 0.1 to 5 parts by mass with respect to 100 parts by mass of the monovinyl monomer.

In a method of producing a toner by the polymerization method, the polymerizable monomer composition generally prepared by the suitable addition of the above-described material and so forth and dissolution or dispersion to uniformity with a disperser such as a homogenizer, a ball mill, or an ultrasonic disperser is suspended in an aqueous medium containing a dispersant. The particle size distribution of the obtained toner particles can be sharpened at this point by providing the desired toner particle size in a short time using a high-speed disperser such as a high-speed agitator or an ultrasonic disperser. As the time at which the polymerization initiator is added, it may be added simultaneously when other additives are added to the polymerizable monomer, or may be mixed immediately before they are suspended in the aqueous medium. Also, a polymerization initiator having been dissolved in the polymerizable monomer or in a solvent may be added immediately after granulation and before the polymerization reaction is initiated.

After granulation, agitation may be carried out using a usual agitator in such an extent that the state of particles is maintained and also the particles can be prevented from floating and settling.

When the toner is produced, any of known surface-active agents or organic or inorganic dispersants may be used as a dispersant. In particular, the inorganic dispersants have dispersion stability on account of their steric hindrance. Hence, even when reaction temperature is changed, they may hardly loose the stability, can be washed with ease and may hardly adversely affect toners, and hence they may preferably be used. Examples of such inorganic dispersants include: sulfates such as barium sulfate and calcium sulfate; carbonates such as barium carbonate, calcium carbonate and magnesium carbonate; phosphates such as calcium phosphate; metal oxides such as aluminum oxide and titanium oxide; and metal hydroxides such as aluminum hydroxide, magnesium hydroxide and iron(II) hydroxide.

Any of these inorganic dispersants may preferably be used in the range of 0.2 to 20 parts by mass with respect to 100 parts by mass of the polymerizable monomer. The above dispersant may also be used alone or in combination of two or more types. In addition, a combined use of 0.001 to 0.1 parts by mass of a surfactant may be made with respect to 100 parts by mass of the polymerizable monomer.

In a step of polymerizing the above-mentioned polymerizable monomer, the polymerization temperature is preferably 50° C. or higher, and more preferably 60° C. or higher and 95° C. or lower. A polymerization reaction time is preferably 1 to 20 hours, and more preferably 2 to 15 hours.

The polymer particles containing the colorant obtained through the above polymerization reaction may be used as a polymerized toner obtained by adding an external additive as it is. It is possible to produce so-called core-shell type (or "capsule type") polymer particles obtained by using the polymer particles as the core layer and forming a shell layer, which is different from the core layer, around the core layer, and thus it is more preferred. The core-shell type polymer particles can take a balance of lowering fixing temperature and prevention of aggregation at storage, since the core layer including a substance having a low softening point is covered with a substance having a higher softening point.

A method for producing the core-shell type polymer particles using the polymer particles described above is not particularly limited, and can be produced by any conventional method. The in situ polymerization method and the phase separation method are preferable from the viewpoint of production efficiency.

A method for producing the core-shell type polymer particles according to the in situ polymerization method will be hereinafter described.

A polymerizable monomer for forming a shell layer (a polymerizable monomer for shell) and a polymerization initiator are added to an aqueous medium to which the polymer particles are dispersed followed by polymerization, thus the core-shell type polymer particles can be obtained.

As the polymerizable monomer for shell, the above-mentioned polymerizable monomer can be similarly used. Among the polymerizable monomers, any of monomers which provide a polymer having glass transition temperature of more than 80° C. such as styrene, acrylonitrile and methyl methacrylate is preferably used alone or in combination of two or more kinds.

Examples of the polymerization initiator used for polymerization of the polymerizable monomer for shell include: water-soluble polymerization initiators including metal persulfates such as potassium persulfate and ammonium persulfate; and azo-type initiators such as 2,2'-azobis(2-methyl-N-(2-hydroxyethyl)propionamide), 2,2'-azobis(2-methyl-N-(1,1-bis(hydroxymethyl)2-hydroxyethyl)propionamide), and 2,2'-azobis(N-(2-carboxyethyl)-2-methylpropionamidine), and hydrate thereof. These polymerization initiators can be used alone or in combination of two or more kinds. The amount of the polymerization initiator added is preferably 0.1 to 30 parts by mass, more preferably 1 to 20 parts by mass, with respect to 100 parts by mass of the polymerizable monomer for shell.

The polymerization temperature of the shell layer is preferably 50° C. or more, and more preferably 60° C. to 95° C. A polymerization reaction time is preferably 1 to 20 hours, and more preferably 2 to 15 hours.

Toner particles are obtained by filtering, washing and drying the obtained polymer particles by a known method. A classification step may optionally be performed to remove a coarse powder and a fine powder in the toner particles.

The toner particles may optionally be mixed with an inorganic fine powder or the like to make it adhere to the surfaces of the toner particles, whereby the toner can be obtained.

The agitator for mixing process is not particularly limited as long as it is an agitator capable of attaching the inorganic fine powder on the surface of the toner particles. The examples include agitators capable of mixing and agitating, such as FM Mixer (product name; manufactured by NIPPON COKE & ENGINEERING CO., LTD.), SUPER MIXER (product name; manufactured by KAWATA Manufacturing Co., Ltd.), Q MIXER (product name; manufactured by NIPPON COKE & ENGINEERING CO., LTD.), Mechanofusion system (product name; manufactured by Hosokawa Micron Corporation) and MECHANOMILL (product name; manufactured by Okada Seiko Co., Ltd.). The external additive can be added by means of the above agitators.

Examples of the inorganic fine powder include: inorganic particles including silica, titanium oxide, aluminum oxide, zinc oxide, tin oxide, calcium carbonate, calcium phosphate and/or cerium oxide; and organic particles including polymethyl methacrylate resin, silicone resin and/or melamine resin. Among them, inorganic particles are preferable. Among the inorganic particles, silica and/or titanium oxide is preferred, and particles including silica are particularly preferred.

These external additives are used alone, or in combination of two or more kinds.

In the present disclosure, it is preferable that the amount of the inorganic fine powder to be used is generally in the range of from 0.05 to 6 parts by mass, preferably from 0.2 to 5 parts by mass, with respect to 100 parts by mass of the toner particles.

A melting temperature Tm of the toner by a ½ method in a flow tester is preferably 100° C. or higher and 150° C. or lower, more preferably 110° C. or higher and 140° C. or lower, and further preferably 120° C. or higher and 130° C. or lower.

By controlling the melting temperature Tm within the above range, it becomes easy to achieve both low-temperature fixability and hot offset resistance.

The glass transition temperature of the toner is preferably 44° C. or higher and 60° C. or lower, more preferably 46° C. or higher and 58° C. or lower, and further preferably 47° C. or higher and 54° C. or lower.

A number average molecular weight (Mn) of the toner is preferably 5,000 to 20,000, more preferably 7,000 to 15,000, and further preferably 8,000 to 10,000. When the number average molecular weight of the toner is 20,000 or less, good low-temperature fixability can be obtained, and when the number average molecular weight is 5,000 or more, good heat-resistant shelf stability can be obtained.

A weight average molecular weight (Mw) of the toner is preferably 100,000 to 400,000, and more preferably 200,000 to 300,000. When the weight average molecular weight of the toner is 400,000 or less, good low-temperature fixability can be obtained, and when the weight average molecular weight is 100,000 or more, good heat-resistant shelf stability can be obtained.

A molecular weight distribution (Mw/Mn) of the toner is preferably 10 to 40, and more preferably 15 to 35. When the molecular weight distribution of the toner is 40 or less, good low-temperature fixability and storability can be obtained, and when the molecular weight distribution is 10 or more, good hot offset resistance can be obtained.

Next, a method of measuring each physical property of the toner will be described.

<Method of Measuring Melting Temperature Tm of Toner by ½ Method>

The melting temperature Tm of the toner by a ½ method in the flow tester can be calculated from a melt viscosity measured by means of the flow tester.

Specifically, for example, about 1.0 to 1.3 g of the toner is put into an elevated flow tester (product name: CFT-500C; manufactured by SHIMADZU CORPORATION), and the melting temperature (Tm) by the ½ method is measured under the following measurement conditions.

Starting temperature: 40° C.
Heating rate: 3° C./minute
Preheating time: 5 minutes
Cylinder pressure: 10 kgf/cm$^2$
Dice diameter: 0.5 mm
Dice length: 1.0 mm
Shear stress: $2.451 \times 10^5$ Pa <Method of Measuring Glass Transition Temperature of Toner>

The glass transition temperature of the toner can be measured with reference to, for example, ASTM D3418-97.

Specifically, differential scanning calorimetry (product name: DSC6220; manufactured by SII Nanotechnology Inc.) is used. In the measurement, about 10 mg of the toner obtained by drying is precisely weighed, and the precisely-weighed measurement sample is put into an aluminum pan. An empty aluminum pan is used as a reference. Subsequently, the glass transition temperature of the toner was measured between a range of a measurement temperature of from 0° C. to 150° C. under a condition of a heating rate of 10° C./minute.

<Method of Measuring Molecular Weight of Toner>

The number average molecular weight (Mn) and the weight average molecular weight (Mw) of the toner can be determined by, for example, gel permeation chromatography (GPC). In GPC, tetrahydrofuran (THF) is used as a solvent. In GPC, the molecular weight obtained by polystyrene conversion is measured.

Specifically, the following method can be used.

(A) Preparation of Sample

About 10 mg of the toner particles was dissolved in 5 mL of a tetrahydrofuran, and the mixture was left at 250° C. for 16 hours and filtered through a 0.45 μm membrane filter to give a sample.

(B) Measurement conditions

Temperature: 350° C., solvent: tetrahydrofuran, flow rate: 1.0 mL/min, concentration: 0.2 wt %, sample injection amount: 100 μL.

(c) Column

GPC TSK gel Multipore HXL-M manufactured by Tosoh Corporation was used (30 cm×2 pieces). The measurement was conducted under the condition that a primary correlation formula: Log (Mw)-elution time at a molecular weight Mw of between 1,000 and 300,000 was 0.98 or more.

<Method of Measuring Melting Point of Monoester Compound Represented by Formula (3)>

About 6 to 8 mg of a sample of softening agents is weighed and put into a sample holder, and the sample is subjected to a measurement by using a differential scanning calorimeter (product name: RDC-220 manufactured by Seiko Instruments Inc.) under a condition in which the temperature raises at 100° C./minute from −200° C. to 1,000° C., whereby a DSC curve is obtained. The top of the peak of the obtained DSC curve is deemed as the melting point.

<Method of Measuring Acid Value of Monoester Compound Represented by Formula (3)>

The acid value of the monoester compound represented by the formula (3) is measured with reference to JIS K 0070, which is a standard method for analyzing fats and oils enacted by Japanese Industrial Standards Committee (JISC).

[Electrophotographic Photosensitive Member]

Hereinafter, the electrophotographic photosensitive member used in the present disclosure will be described.

A method of producing the electrophotographic photosensitive member is, for example, a method involving: preparing coating liquids for the respective layers to be described later; applying the liquids in a desired layer order; and drying the liquids. At this time, a method of applying each of the coating liquids is, for example, dip coating, spray coating, inkjet coating, roll coating, die coating, blade coating, curtain coating, wire bar coating, or ring coating. Of these, dip coating is preferred from the viewpoints of efficiency and productivity.

The respective layers will be described below.

<Support>

In the present disclosure, the electrophotographic photosensitive member has a support. In the present disclosure, the support is preferably an electroconductive support having electroconductivity. In addition, examples of the shape of the support include a cylindrical shape, a belt shape, and a sheet shape. Of these, a cylindrical support is preferred. In addition, the surface of the support may be subjected to, for example, an electrochemical treatment, such as anodization, a blast treatment, or a cutting treatment.

A metal, a resin, a glass, or the like is preferred as a material for the support.

Examples of the metal include aluminum, iron, nickel, copper, gold, and stainless steel, and alloys thereof. Of these, an aluminum support using aluminum is preferred.

In addition, electroconductivity may be imparted to the resin or the glass through a treatment involving, for example, mixing or coating the resin or the glass with an electroconductive material.

<Undercoat Layer>

In the present disclosure, an undercoat layer may be arranged on the support. The arrangement of the undercoat layer can improve an adhesive function between layers to impart a charge injection-inhibiting function.

The undercoat layer preferably contains a resin. In addition, the undercoat layer may be formed as a cured film by polymerizing a composition containing a monomer having a polymerizable functional group.

Examples of the resin include a polyester resin, a polycarbonate resin, a polyvinyl acetal resin, an acrylic resin, an epoxy resin, a melamine resin, a polyurethane resin, a phenol resin, a polyvinyl phenol resin, an alkyd resin, a polyvinyl alcohol resin, a polyethylene oxide resin, a polypropylene oxide resin, a polyamide resin, a polyamide acid resin, a polyimide resin, a polyamide imide resin, and a cellulose resin.

Examples of the polymerizable functional group of the monomer having a polymerizable functional group include an isocyanate group, a blocked isocyanate group, a methylol group, an alkylated methylol group, an epoxy group, a metal alkoxide group, a hydroxyl group, an amino group, a carboxyl group, a thiol group, a carboxylic acid anhydride group, and a carbon-carbon double bond group.

In addition, the undercoat layer may further contain an electron-transporting substance, a metal oxide, a metal, an electroconductive polymer, and the like for the purpose of improving electric characteristics. Of those, an electron-transporting substance and a metal oxide are preferably used.

Examples of the electron-transporting substance include a quinone compound, an imide compound, a benzimidazole compound, a cyclopentadienylidene compound, a fluorenone compound, a xanthone compound, a benzophenone compound, a cyanovinyl compound, a halogenated aryl compound, a silole compound, and a boron-containing compound. An electron-transporting substance having a polymerizable functional group may be used as the electron-transporting substance and copolymerized with the above-mentioned monomer having a polymerizable functional group to form an undercoat layer as a cured film.

Examples of the metal oxide include indium tin oxide, tin oxide, indium oxide, titanium oxide, zinc oxide, aluminum oxide, and silicon dioxide. Examples of the metal include gold, silver and aluminum.

The undercoat layer may further contain an additive.

The average film thickness of the undercoat layer is preferably 0.1 μm to 50 μm, more preferably 0.2 μm to 40 μm, and particularly preferably 0.3 μm to 30 μm.

The undercoat layer may be formed by: preparing a coating liquid for an undercoat layer containing the above-mentioned respective materials and a solvent; forming a coat of the liquid; and drying and/or curing the coat. Examples of the solvent to be used for the coating liquid include an alcohol-based solvent, a ketone-based solvent, an ether-based solvent, an ester-based solvent, and an aromatic hydrocarbon-based solvent.

<Photosensitive Layer>

The photosensitive layers of the electrophotographic photosensitive member are mainly classified into (1) a monolayer type photosensitive layer and (2) a laminate type photosensitive layer. (1) The monolayer type photosensitive layer has a photosensitive layer containing all of the charge-generating substance, the charge-transporting substance, and the electron-transporting substance. (2) The laminate type photosensitive layer has a charge-generating layer containing the charge-generating substance and a charge-transporting layer containing the charge-transporting substance.

In the present disclosure, when the photosensitive layer is (1) the monolayer type photosensitive layer, the monolayer type photosensitive layer is a surface layer, and when the photosensitive layer is (2) the laminate type photosensitive layer, the charge-transporting layer is a surface layer.

As described above, the surface layer contains the binder resin (A) and silica particles.

$R^{21}$ and $R^{24}$ in the formula (2) are hydrogen atoms, and $R^{22}$ and $R^{23}$ are bonded to each other to form a cycloalkylidene group. A molar ratio between the structure represented by the formula (1) and the structure represented by the formula (2) is preferably in a range of 1:3 to 7:3. Furthermore, the molar ratio between the structure represented by the formula (1) and the structure represented by the formula (2) is more preferably in a range of 1:3 to 1:1. Consequently, both the effect of scraping off the charged product on the surface of the electrophotographic photosensitive member and the wear resistance of the electrophotographic photosensitive member can be obtained satisfactorily.

The molecular weight of the binder resin (A) is preferably 10,000 to 300,000 in terms of the weight average molecular weight (Mw).

Table 1 shows specific examples of the binder resin (A).

TABLE 1

| Binder resin (A) | Formula (1) $R^{11}, R^{12}$ | Formula (2) | | | (1):(2) Molar ratio |
|---|---|---|---|---|---|
| | | $R^{21}, R^{24}$ | $R^{22}$ | $R^{23}$ | |
| Resin 1 | H | Methyl | Cyclohexylidene | | 30:70 |
| Resin 2 | H | Methyl | Cyclohexylidene | | 25:75 |
| Resin 3 | H | Methyl | Cyclohexylidene | | 35:65 |
| Resin 4 | H | Methyl | Cyclohexylidene | | 40:60 |
| Resin 5 | H | Methyl | Cyclohexylidene | | 50:50 |
| Resin 6 | H | Methyl | Cyclohexylidene | | 20:80 |
| Resin 7 | H | H | Cyclohexylidene | | 30:70 |
| Resin 8 | Methyl | Methyl | Cyclohexylidene | | 30:70 |
| Resin 9 | Methyl | H | Cyclohexylidene | | 30:70 |
| Resin 10 | H | Methyl | Methyl | Methyl | 30:70 |
| Resin 11 | H | Methyl | Methyl | Phenyl | 30:70 |
| Resin 12 | H | Methyl | Hydrogen | Methyl | 30:70 |
| Resin 13 | H | Methyl | Methyl | Ethyl | 30:70 |

The surface layer may contain a resin other than the binder resin (A) in such a range that the advantages of the present disclosure are not impaired. Examples of other resins include polycarbonate resin, styrene resin, and acrylic resin.

The content of the binder resin (A) in the resin contained in the surface layer is preferably 60% by mass or more, and more preferably 80% by mass or more.

The silica particles contained in the surface layer are preferably surface-treated silica particles. By surface-treating the silica particles, uniformity of the silica particles in the binder resin (A) is increased, and the effect of the present disclosure can be obtained more satisfactorily.

Examples of surface treatment agents for applying a surface treatment to silica particles include hexamethyldisilazane, N-methyl-hexamethyldisilazane, hexamethyl-N-propyldisilazane, dimethyldichlorosilane, and polydimethylsiloxane. Hexamethyldisilazane is particularly preferred as the surface treatment agent from the viewpoint of dispersibility to the binder resin (A).

The content of silica particles in the surface layer is preferably 0.5 to 15 parts by mass with respect to 100 parts by mass of the binder resin (A). When the content is 0.5 to 15 parts by mass, the effect of scraping off the charged product can be obtained satisfactorily.

The particle size (number average particle size) of the silica particles is preferably 7 nm to 1000 nm, and more preferably 10 nm to 300 nm.

The particle size can be measured using a dynamic light scattering method. For example, particles are dispersed in an appropriate organic solvent, the particle size distribution of the particles is prepared based on mass using a dense particle size analyzer FPAR-1000 (manufactured by Otsuka Electronics Co., Ltd.), and a median diameter D50 of the distribution is used as an average particle size to measure the particle size. At this time, examples of a method of dispersing the particles include a method using a homogenizer, an ultrasonic disperser, a ball mill, a sand mill, a roll mill, or a vibration mill.

(1) Monolayer Type Photosensitive Layer

The photosensitive layer is preferably a monolayer type photosensitive layer containing a charge-generating substance, a hole-transporting substance, and an electron-transporting substance. The monolayer type photosensitive layer can be formed by preparing a coating liquid for a photosensitive layer containing a resin and a solvent in addition to the charge-generating substance, the hole-transporting substance, and the electron-transporting substance, forming a coat of the liquid, and drying the coat.

Examples of the charge-generating substance include azo pigments, perylene pigments, polycyclic quinone pigments, indigo pigments, and phthalocyanine pigments. Of those, an azo pigment or a phthalocyanine pigment is preferred. Among the phthalocyanine pigments, metal-free phthalocyanine, oxytitanium phthalocyanine pigment, chlorogallium phthalocyanine pigment, and hydroxygallium phthalocyanine pigment are preferred.

Examples of the hole-transporting substance include a polycyclic aromatic compound, a heterocyclic compound, a hydrazone compound, a styryl compound, an enamine compound, a benzidine compound, a triarylamine compound, and a resin having a group derived from each of those substances. These charge-transporting substances can be used alone or in combination of two or more kinds. Of those, a triarylamine compound and a benzidine compound are preferred.

Examples of electron-transporting substances include quinone-based compounds, diimide-based compounds, hydrazone-based compounds, malononitrile-based compounds, thiopyran-based compounds, trinitrothioxanthone-based compounds, 3,4,5,7-tetranitro-9-fluorenone-based compounds, dinitroanthracene-based compounds, dinitroacridine-based compounds, tetracyanoethylene, 2,4,8-trinitrothioxanthone, dinitrobenzene, dinitroacridine, succinic anhydride, maleic anhydride, and dibromomaleic anhydride.

Examples of quinone-based compounds include diphenoquinone-based compounds, azoquinone-based compounds, anthraquinone-based compounds, naphthoquinone-based compounds, nitroanthraquinone-based compounds, and dinitroanthraquinone-based compounds. These electron-transporting substances can be used alone or in combination of two or more kinds.

Of these, the electron-transporting substance is preferably at least one compound selected from the group consisting of the compounds represented by the following formulas (4) to (12). Consequently, compatibility between the electron-transporting substance, the binder resin (A), and the silica particles increases, and uniformity of the photosensitive layer is enhanced. Thus, the effect of scraping off the charged product can be obtained satisfactorily, and the effect of suppressing the image flow can also be obtained satisfactorily.

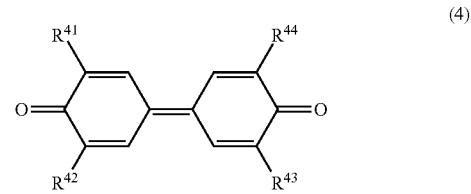

(4)

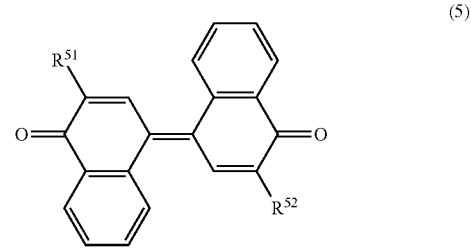

(5)

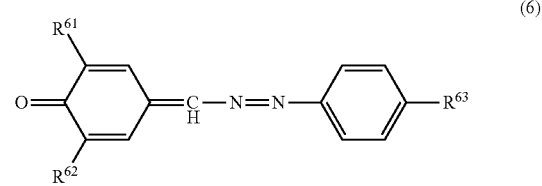

(6)

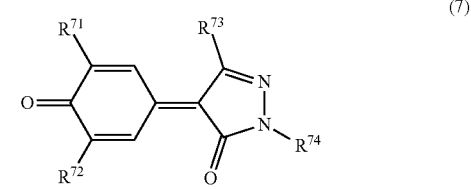

(7)

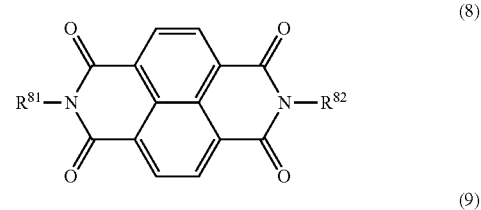

(8)

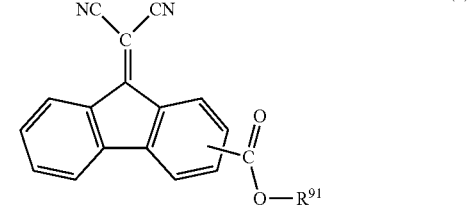

(9)

-continued

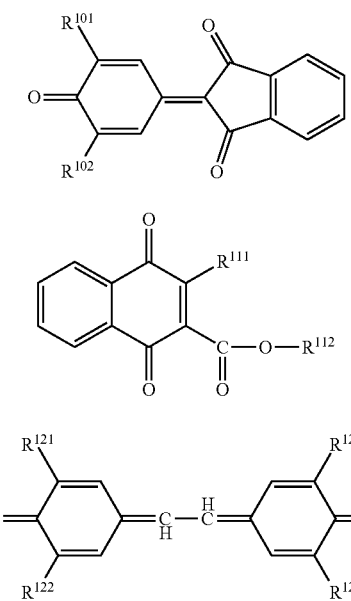

(In formulas (4) to (12), $R^{41}$ to $R^{44}$, $R^{51}$, $R^{52}$, $R^{61}$, $R^{62}$, $R^{71}$ to $R^{73}$, $R^{101}$, $R^{102}$, and $R^{121}$ to $R^{124}$ each independently represent a hydrogen atom or an alkyl group having 1 to 6 carbon atoms.

$R^{63}$ represents a hydrogen atom, a halogen group, or an alkyl group having 1 to 6 carbon atoms.

$R^{74}$, $R^{31}$, and $R^{82}$ each independently represent an alkyl group having 1 to 6 carbon atoms, a halogen group, or a phenyl group which may have an alkyl group having 1 to 6 carbon atoms.

$R^{91}$ represents an alkyl group having 1 to 6 carbon atoms which may have a hydrogen atom or a halogen atom.

$R^{111}$ and $R^{112}$ each independently represent an alkyl group having 1 to 6 carbon atoms which may have a halogen group, a phenyl group which may have a halogen group or an alkyl group having 1 to 6 carbon atoms, or a benzyl group which may have a halogen group or an alkyl group having 1 to 6 carbon atoms.)

Table 2 shows specific examples of the electron-transporting substance.

TABLE 2

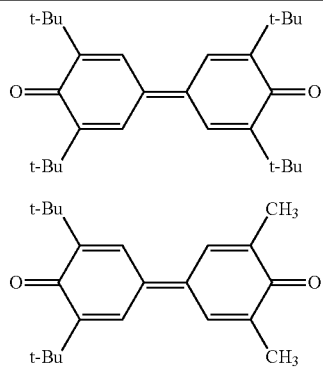

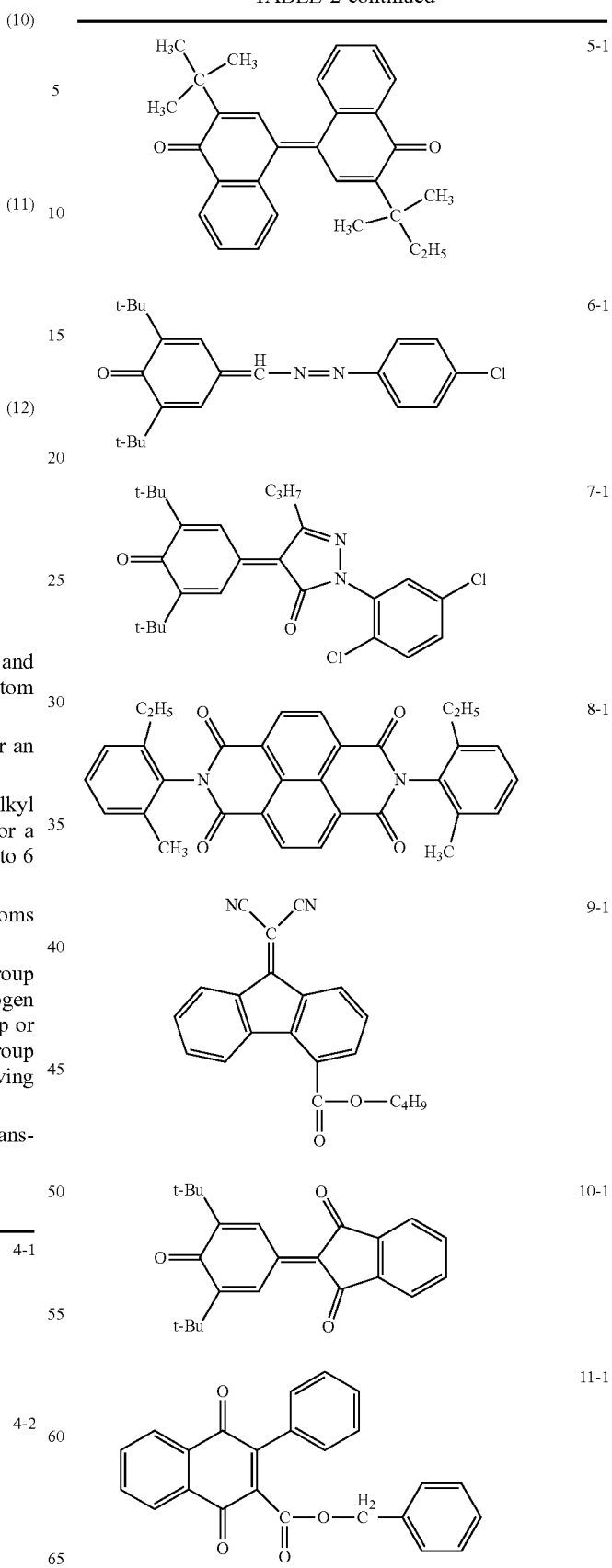

TABLE 2-continued

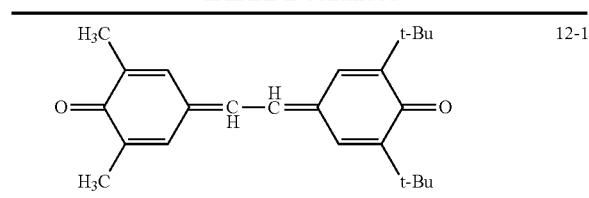

12-1

A content ratio (mass ratio) between the charge-generating substance and the resin in the photosensitive layer is preferably in a range of from 1:1,000 to 50:100, and more preferably in a range of from 5:1,000 to 30:100.

A content ratio (mass ratio) between the charge-transporting substance and the resin in the photosensitive layer is preferably in a range of from 1:10 to 20:10, and more preferably in a range of from 1:10 to 10:10.

A content ratio (mass ratio) between the electron-transporting substance and the resin in the photosensitive layer is preferably in a range of from 5:100 to 10:10, and more preferably in a range of from 1:10 to 8:10.

The film thickness of the photosensitive layer is preferably 5 μm to 100 μm, and more preferably 10 μm to 50 μm.

In addition, the photosensitive layer may contain an additive, such as an antioxidant, a UV absorber, a plasticizer, a leveling agent, a sliding property-imparting agent, or an abrasion resistance-improving agent. Specific examples thereof include a hindered phenol compound, a hindered amine compound, a sulfur compound, a phosphorus compound, a benzophenone compound, a siloxane-modified resin, a silicone oil, fluorine resin particles, polystyrene resin particles, polyethylene resin particles, alumina particles, and boron nitride particles.

The photosensitive layer may be formed by: preparing a coating liquid for a photosensitive layer containing the above-mentioned respective materials and a solvent; forming a coat of the liquid; and drying the coat. Examples of the solvent to be used for the coating liquid include an alcohol-based solvent, a ketone-based solvent, an ether-based solvent, an ester-based solvent, and an aromatic hydrocarbon-based solvent. Of these solvents, the ether-based solvent or the aromatic hydrocarbon-based solvent is preferred.

(2) Laminate Type Photosensitive Layer

The laminate type photosensitive layer has a charge-generating layer and a charge-transporting layer.

The charge-generating layer contains a charge-generating substance and a resin, and the charge-transporting layer contains a hole-transporting substance and a resin.

Examples of the charge-generating substance, the charge-transporting substance, and the resin are the same as the examples of the materials in "(1) Monolayer type photosensitive layer" described above.

The content of the charge-generating substance in the charge-generating layer is preferably 40% to 85% by mass, more preferably 60% to 80% by mass with respect to the total mass of the charge-generating layer.

The film thickness of the charge-generating layer is preferably 0.1 μm to 1 μm, and more preferably 0.15 μm to 0.4 μm.

The content of the charge-transporting substance in the charge-transporting layer is preferably 25% to 70% by mass, more preferably 30% to 55% by mass with respect to the total mass of the charge-transporting layer.

A content ratio (mass ratio) between the hole-transporting substance in the charge-transporting layer and the resin is preferably from 4:10 to 20:10, and more preferably from 5:10 to 12:10.

The additive exemplified in "(1) Monolayer type photosensitive layer" described above may be contained.

The film thickness of the charge-transporting layer is preferably 5 μm to 50 μm, more preferably 8 μm to 40 μm, and particularly preferably 10 μm to 30 μm.

[Image Forming Apparatus]

The image forming apparatus according to the present disclosure has the electrophotographic photosensitive member described above, a charging unit that forms an electrostatic image on an outer surface of the electrophotographic photosensitive member, a developing unit that supplies a toner to the electrostatic image to form a toner image, and a transfer unit that transfers the toner image to a transfer medium. The transfer medium is preferably paper.

FIGURE shows an example of a schematic configuration of an image forming apparatus having a process cartridge provided with an electrophotographic photosensitive member.

An electrophotographic photosensitive member 1 having a cylindrical shape is rotationally driven at a predetermined peripheral speed in a direction indicated by the arrow about an axis 2 as a center. A surface of the electrophotographic photosensitive member 1 is charged to a predetermined positive or negative potential by a charging unit 3. In FIGURE, a roller charging system based on a roller-type charging member is illustrated, but a charging system, such as a corona charging system, a proximity charging system, or an injection charging system, may be adopted. The charged surface of the electrophotographic photosensitive member 1 is irradiated with exposure light 4 from an exposing unit (not shown), and hence an electrostatic latent image corresponding to target image information is formed thereon. The electrostatic latent image formed on the surface of the electrophotographic photosensitive member 1 is developed with a toner stored in a developing unit 5, and hence a toner image is formed on the surface of the electrophotographic photosensitive member 1. The toner image formed on the surface of the electrophotographic photosensitive member 1 is transferred onto a transfer material 7 by a transfer unit 6. The transfer material 7 onto which the toner image has been transferred is conveyed to a fixing unit 8, is subjected to a treatment for fixing the toner image, and is printed out to the outside of the image forming apparatus. The image forming apparatus may include a cleaning unit 9 for removing a deposit, such as the toner remaining on the surface of the electrophotographic photosensitive member 1 after the transfer. In addition, a so-called cleaner-less system configured to remove the deposit with the developing unit 5 or the like without separate arrangement of the cleaning unit 9 may be used. The image forming apparatus may include an electricity-removing mechanism configured to subject the surface of the electrophotographic photosensitive member 1 to an electricity-removing treatment with pre-exposure light 10 from a pre-exposing unit (not shown). In addition, a guiding unit 12, such as a rail, may be arranged for removably mounting a process cartridge 11 onto the main body of the image forming apparatus of the present disclosure.

[Image Forming Method]

An image forming method according to the present disclosure is an image forming method including forming an electrostatic image on an outer surface of an electrophotographic photosensitive member having a support and a photosensitive layer, supplying a toner to the electrostatic image to form a toner image, and transferring the toner image on a transfer medium. In this image forming method, a surface layer of the electrophotographic photosensitive member contains a binder resin (A) and silica particles, and the binder resin (A) has a structure represented by the formula (1) and a structure represented by the formula (2):

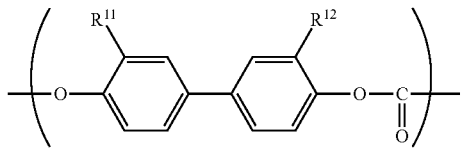

(In formula (1), $R^{11}$ and $R^{12}$ each independently represent a hydrogen atom or a methyl group.)

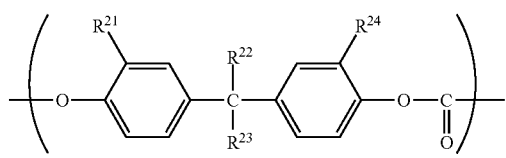

(In formula (2), $R^{21}$ and $R^{24}$ each independently represent a hydrogen atom or a methyl group.
$R^{22}$ and $R^{23}$ each independently represent a hydrogen atom, a methyl group, an ethyl group or a phenyl group, or $R^{22}$ and $R^{23}$ combine with each other to form a cycloalkylidene group.)
in which the toner has toner particles, the toner particles contain a binder resin (B) and a wax, and the wax contains a monoester compound represented by the following formula (3):

$$R^{31}\text{—COO—}R^{32} \quad (3)$$

(In formula (3), $R^{31}$ and $R^{32}$ each independently represent an alkyl group having 10 to 30 carbon atoms.)

According to the present disclosure, it is possible to provide an image forming apparatus, which has high durability and good low-temperature fixability and further suppresses the occurrence of image flow in a high temperature and high humidity environment, and an image forming method.

EXAMPLE

The present disclosure is described in more detail below by way of Examples and Comparative Examples. The invention is by no means limited to the following Examples, and various modifications may be made without departing from the gist of the present disclosure. In the description of the following Examples, "part(s)" is based on mass unless otherwise specified. The electrophotographic photosensitive member is also simply referred to as a photosensitive member.

Production Example of Resin 1

The following materials were provided.
10.6 g of diol represented by the following formula (13)

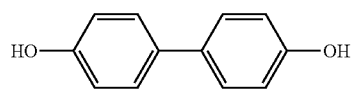

39.4 g of diol represented by the following formula (14)

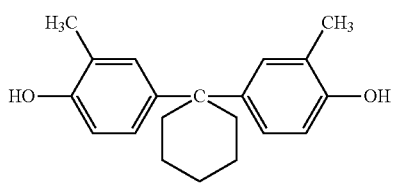

0.1 g of hydrosulfite

These materials were dissolved in 1100 ml of a 5 mass % sodium hydroxide aqueous solution. To this solution, 500 ml of methylene chloride was added with stirring, and while the temperature was kept at 15° C., 60.0 g of phosgene was then injected over 60 minutes.

After completion of the injection of phosgene, 1.0 g of p-t-butylphenol was added as a molecular weight modifier and stirred to emulsify the reaction solution. After emulsification, 0.3 ml of triethylamine was added, and the mixture was stirred at 23° C. for 1 hour to polymerize.

After completion of the polymerization, the reaction solution was separated into a water phase and an organic phase. The organic phase was neutralized with phosphoric acid and washed with water repeatedly until the conductivity of the wash liquid (water phase) became 10 μS/cm or less. The obtained polymer solution was added dropwise to hot water with its temperature being maintained at 45° C. and the solvent was removed by evaporation, thereby obtaining a powdery white precipitate. The obtained precipitate was filtered and dried at 110° C. for 24 hours, thereby obtaining a resin 1.

As a result of confirming the obtained resin 1 by 1H-NMR, the resin 1 was a resin having 30 mol % of a structure derived from the compound represented by the formula (13) and 70 mol % of a structure derived from the compound represented by the formula (14).

Production Examples of Resins 2 to 13

Resins 2 to 13 were produced in the same manner as in the resin 1, except that in the production of the resin 1, the type of diol used was changed, and the amount of diol was adjusted so as to obtain a resin having the structures represented by the formulas (1) and (2) at a molar ratio described in Table 1.

Production Example of Photosensitive Member D-1

The following materials were provided.
3.0 parts of metal-free phthalocyanine pigment as a charge-generating substance
As a hole-transporting substance, 60.0 parts of the compound represented by the following formula (15)

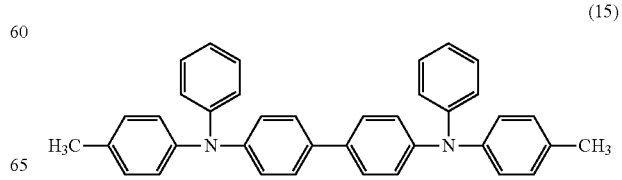

12.0 parts of electron-transporting substance 4-1 as an electron-transporting substance 28.0 parts of electron-transporting substance 5-1 as an electron-transporting substance 1.0 part of silica particles 1 (Aerosil RX200 from Nippon Aerosil Co., Ltd. 12 nm) surface-treated with hexamethyldisilazane 100 parts of the resin 1 with a weight average molecular weight (Mw) of 30,000 as a binder resin 800 parts of tetrahydrofuran as a solvent These materials were put into a container.

Using a rod-shaped ultrasonic disperser, the materials in the container and the solvent were mixed for 2 minutes, and the materials were dispersed in the solvent. In addition, using a ball mill, the materials and the solvent were mixed for 50 hours, and the materials were dispersed in the solvent to prepare a coating liquid for a photosensitive layer.

This coating liquid for a photosensitive layer was dip-coated on an aluminum support (JIS-A3003, aluminum alloy) as an electroconductive substrate, and dried at 100° C. for 40 minutes to prepare a photosensitive member D-1 having a monolayer type photosensitive layer with a film thickness of 25 pin.

Production Examples of Photosensitive Members D-2 to D-34

Photosensitive members D-2 to D-34 were produced in the same manner as in the production example of the photosensitive member D-1, except that the binder resin (A), the amount of silica particles added, and the electron-transporting substance were changed as shown in Table 3.

The details of the silica particles shown in Table 3 are as follows.

Silica particle 2 Silica surface-treated with hexamethyldisilazane Particle size 7 nm (Product name: RX300, manufactured by Nippon Aerosil Co., Ltd.)

Silica particle 3 Silica surface-treated with hexamethyldisilazane Particle size 50 nm (Product name: NAX50, manufactured by Nippon Aerosil Co., Ltd.)

Silica particle 4 Silica without surface treatment Particle size 300 nm (Product name: KE-P30, manufactured by Nippon Shokubai Co., Ltd.)

Silica particle 5 Silica without surface treatment Particle size 1,000 nm (Product name: KE-P150, manufactured by Nippon Shokubai Co., Ltd.)

Silica particle 6 Silica surface-treated with dimethyldichlorodisilazane Particle size 12 nm (Product name: R974, manufactured by Nippon Aerosil Co., Ltd.)

Silica particle 7 Silica surface-treated with polydimethylsiloxane Particle size 12 nm (Product name: RY200, manufactured by Nippon Aerosil Co., Ltd.)

TABLE 3

| Photosensitive member | Binder resin (A) | Silica particle Type | Silica particle Amount (to 100 parts of resin) | Electron-transporting substance Type | Electron-transporting substance Amount (to 100 parts of resin) |
|---|---|---|---|---|---|
| D-1 | Resin 1 | Silica particle 1 | 1 | 4-1/5-1 | 12/28 |
| D-2 | Resin 2 | Silica particle 1 | 1 | 4-1/5-1 | 12/28 |
| D-3 | Resin 3 | Silica particle 1 | 1 | 4-1/5-1 | 12/28 |
| D-4 | Resin 4 | Silica particle 1 | 1 | 4-1/5-1 | 12/28 |
| D-5 | Resin 5 | Silica particle 1 | 1 | 4-1/5-1 | 12/28 |
| D-6 | Resin 6 | Silica particle 1 | 1 | 4-1/5-1 | 12/28 |
| D-7 | Resin 7 | Silica particle 1 | 1 | 4-1/5-1 | 12/28 |
| D-8 | Resin 8 | Silica particle 1 | 1 | 4-1/5-1 | 12/28 |
| D-9 | Resin 9 | Silica particle 1 | 1 | 4-1/5-1 | 12/28 |
| D-10 | Resin 10 | Silica particle 1 | 1 | 4-1/5-1 | 12/28 |
| D-11 | Resin 11 | Silica particle 1 | 1 | 4-1/5-1 | 12/28 |
| D-12 | Resin 12 | Silica particle 1 | 1 | 4-1/5-1 | 12/28 |
| D-13 | Resin 13 | Silica particle 1 | 1 | 4-1/5-1 | 12/28 |
| D-14 | Resin 1 | Silica particle 1 | 0.5 | 4-1/5-1 | 12/28 |
| D-15 | Resin 1 | Silica particle 1 | 5 | 4-1/5-1 | 12/28 |
| D-16 | Resin 1 | Silica particle 1 | 10 | 4-1/5-1 | 12/28 |
| D-17 | Resin 1 | Silica particle 1 | 15 | 4-1/5-1 | 12/28 |
| D-18 | Resin 1 | Silica particle 1 | 20 | 4-1/5-1 | 12/28 |
| D-19 | Resin 1 | Silica particle 1 | 0.1 | 4-1/5-1 | 12/28 |
| D-20 | Resin 1 | Silica particle 2 | 1 | 4-1/5-1 | 12/28 |
| D-21 | Resin 1 | Silica particle 3 | 1 | 4-1/5-1 | 12/28 |
| D-22 | Resin 1 | Silica particle 4 | 1 | 4-1/5-1 | 12/28 |
| D-23 | Resin 1 | Silica particle 5 | 1 | 4-1/5-1 | 12/28 |
| D-24 | Resin 1 | Silica particle 6 | 1 | 4-1/5-1 | 12/28 |
| D-25 | Resin 1 | Silica particle 7 | 1 | 4-1/5-1 | 12/28 |
| D-26 | Resin 1 | Silica particle 1 | 1 | 4-2 | 40 |
| D-27 | Resin 1 | Silica particle 1 | 1 | 5-1 | 40 |
| D-28 | Resin 1 | Silica particle 1 | 1 | 6-1 | 30 |
| D-29 | Resin 1 | Silica particle 1 | 1 | 7-1 | 30 |
| D-30 | Resin 1 | Silica particle 1 | 1 | 8-1 | 30 |
| D-31 | Resin 1 | Silica particle 1 | 1 | 9-1 | 30 |
| D-32 | Resin 1 | Silica particle 1 | 1 | 10-1 | 30 |
| D-33 | Resin 1 | Silica particle 1 | 1 | 11-1 | 30 |
| D-34 | Resin 1 | Silica particle 1 | 1 | 12-1 | 30 |

Production Example of Photosensitive Member D-35

A photosensitive member D-35 was prepared in the same manner as in the production example of the photosensitive member D-1 except that the silica particles 1 surface-treated with hexamethyldisilazane were not added.

Production Example of Photosensitive Member D-36

A photosensitive member D-36 was prepared in the same manner as in the production example of the photosensitive member D-1 except that the resin 1 was changed to a resin with a weight average molecular weight (Mw) of 30000 having a repeating unit having a structure represented by the following formula (16):

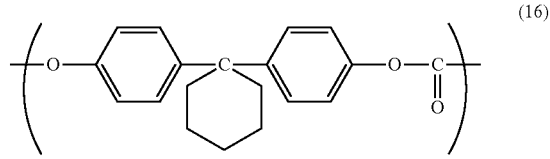

Production Example of Wax A-1

To a reactor equipped with a thermometer, a nitrogen introduction tube, an agitator, a Dean-Stark trap and a Dimroth cooling tube, 100 parts of behenyl alcohol as alcohol and 80 parts of stearic acid as carboxylic acid were added, and an esterification reaction was conducted at 200° C. for 15 hours. To the obtained ester compound, 20 parts of toluene and 25 parts of isopropanol were added, and 190 parts of 10% aqueous potassium hydroxide solution in an amount corresponding to 1.5 times the acid value of the ester compound was added, and the mixture was agitated at 70° C. for 4 hours. Then, a water phase part was removed.

In addition, 20 parts of ion-exchanged water was put therein, and the mixture was agitated at 70° C. for 1 hour. Then, the water phase part was removed for washing. The above washing step was repeated until the pH of the removed water phase became neutral. Then, the solvent was removed under reduced pressure at 200° C. and 1 kPa to obtain behenyl stearate (wax A-1), which is an ester compound of behenyl alcohol and stearic acid as a desired final product. Table 4 shows physical properties of the obtained wax A-1.

Production Example of Wax A-2

In the production example of the wax A-1, eicosyl alcohol as alcohol and eicosanoic acid as carboxylic acid were added in a 1.05 molar equivalent amount with respect to the amount of the eicosyl alcohol, and a reaction was conducted under a nitrogen flow at 220° C. for 15 hours at an ordinary pressure, while the water generated by the reaction was distilled off. Consequently, an esterified crude product was obtained.

Eicosyl eicosanoate (wax A-2) was obtained in the same manner as in the production example of the wax A-1, except for the above. Table 4 shows physical properties of the obtained wax A-2.

Production Example of Wax A-3

In the production example of the wax A-1, stearyl alcohol as alcohol and behenic acid as carboxylic acid were added in a 1.05 molar equivalent amount with respect to the amount of the stearyl alcohol, and a reaction was conducted under a nitrogen flow at 220° C. for 15 hours at an ordinary pressure, while the water generated by the reaction was distilled off. Consequently, an esterified crude product was obtained.

Stearyl behenate (wax A-3) was obtained in the same manner as in the production example of the wax A-1, except for the above. Table 4 shows physical properties of the obtained wax A-3.

Production Example of Wax A-4

In the production example of the wax A-1, eicosanoic acid as carboxylic acid was added in a 1.05 molar equivalent amount with respect to the amount of the behenyl alcohol, and a reaction was conducted under a nitrogen flow at 220° C. for 15 hours at an ordinary pressure, while the water generated by the reaction was distilled off, thus obtaining an esterified crude product.

Behenyl eicosanoate (wax A-4) was obtained in the same manner as in the production example of the wax A-1, except for the above. Table 4 shows physical properties of the obtained wax A-4.

Production Example of Wax A-5

In the production example of the wax A-1, tetracosyl alcohol as alcohol and palmitic acid as carboxylic acid were added in a 1.05 molar equivalent amount with respect to the amount of the tetracosyl alcohol, and a reaction was conducted under a nitrogen flow at 220° C. for 15 hours at an ordinary pressure, while the water generated by the reaction was distilled off, thus obtaining an esterified crude product.

Tetracosyl palmitate (wax A-5) was obtained in the same manner as in the production example of the wax A-1, except for the above. Table 4 shows physical properties of the obtained wax A-5.

Production Example of Wax A-6

In the production example of the wax A-1, behenic acid as carboxylic acid was added in a 1.08 molar equivalent amount with respect to the amount of the behenyl alcohol, and a reaction was conducted under a nitrogen flow at 220° C. for 15 hours at an ordinary pressure, while the water generated by the reaction was distilled off, thus obtaining an esterified crude product.

Behenyl behenate (wax A-6) was obtained in the same manner as in the production example of the wax A-1, except for the above. Table 4 shows physical properties of the obtained wax A-6.

TABLE 4

| | Wax | | | | | |
|---|---|---|---|---|---|---|
| | A-1 | A-2 | A-3 | A-4 | A-5 | A-6 |
| Monoester compound represented by Formula (3) | Behenyl stearate | Eicosyl eicosanoate | Stearyl behenate | Behenyl eicosanoate | Tetracosyl palmitate | Behenyl behenate |
| Number of carbon atoms of group represented by $R^{31}$ | 17 | 19 | 21 | 19 | 15 | 21 |
| Number of carbon atoms of group represented by $R^{32}$ | 22 | 20 | 18 | 22 | 24 | 22 |
| Number of carbon atoms per molecule | 40 | 40 | 40 | 42 | 40 | 44 |
| Melting point (° C.) | 67 | 65 | 70 | 74 | 72 | 75 |
| Acid value | 0.1 | 0.1 | 0.1 | 0.1 | 0.1 | 1.1 |

Production Example of Toner T-1

The following materials were provided.
Polymerizable monomer: 74 parts of styrene, 26 parts of n-butyl acrylate
Colorant: 7 parts of carbon black (manufactured by Mitsubishi Chemical Corporation, product name: #25B)
Crosslinking agent: 0.74 parts of divinylbenzene
Charge control agent: 0.37 parts of styrene/acrylic resin (manufactured by Fujikura Kasei Co., Ltd., product name: FCA-592P)
Molecular weight modifier: 1 part of tetraethylthiuram disulfide
Macromonomer: 0.25 parts of polymethacrylic acid ester macromonomer (manufactured by Toagosei Co., Ltd., product name: AA6, glass transition temperature 94° C.)

These materials were agitated and mixed in an agitator, and then subjected to homogenized dispersion by means of a media type disperser, and the mixture was heated to 63° C. Thereto, 20 parts of wax A-1 was added and mixed to be dissolved to give a polymerizable monomer composition.

Separately, in an agitating chamber, an aqueous solution of 4.1 parts of sodium hydroxide dissolved in 50 parts of ion-exchanged water was gradually added to an aqueous solution of 7.4 parts of magnesium chloride dissolved in 250 parts of ion-exchanged water at room temperature while agitating. Consequently, a magnesium hydroxide colloid dispersion (3.0 parts of magnesium hydroxide) was prepared.

The above polymerizable monomer composition was charged into the above-obtained magnesium hydroxide colloid dispersion at room temperature, the temperature was raised to 60° C., and the mixture was agitated until the droplets were stable. Then, 5 parts of t-butylperoxy-2-ethylhexanoate (manufactured by NOF Corporation, product name: PERBUTYL 0) as a polymerization initiator was added therein. Thereafter, the mixture was subjected to a high shear agitation at 15,000 rpm by means of an in-line type emulsifying and disperser (manufactured by Pacific Machinery & Engineering Co., Ltd., product name: MILDER). Thus, droplets of the polymerizable monomer composition were formed.

The above magnesium hydroxide colloid dispersion containing the droplets of the polymerizable monomer composition dispersed therein was put into a reactor equipped with agitation blades, and the temperature was raised to 89° C. so as to keep the temperature constant, and a polymerization reaction was conducted. Then, when the polymerization conversion reached 98%, the temperature in the system was cooled to 75° C., and at 15 minutes after the temperature reached 75° C., the following materials were added.

3 parts of methyl methacrylate as a polymerizable monomer for shell
0.36 parts of 2,2'-azobis [2-methyl-N-(1,1-bis(hydroxymethyl)2-hydroxyethyl)propionamide]tetrahydrate (manufactured by Wako Pure Chemical Industries, Ltd., product name: VA086) dissolved in 10 parts of ion-exchanged water The polymerization was continued for further 3 hours, and then the reaction was stopped, whereby an aqueous dispersion of colored resin particles having a pH of 9.5 was obtained.

Then, the aqueous dispersion of the colored resin particles was set to 80° C., a stripping treatment was conducted at a nitrogen gas flow amount of 0.6 m$^3$/(hr·kg) for 5 hours, and the aqueous dispersion was cooled to 25° C. Then, the pH of the system was adjusted to 6.5 or less with sulfuric acid, the obtained aqueous dispersion was subjected to acid washing under agitation at 25° C., the water was separated by filtration. Then, a slurry was formed again by newly adding 500 parts of ion-exchanged water, and water washing was performed. Then, dehydration and water washing were repeatedly conducted several times again, and the solid content was separated by filtration, then put into a drier, and dried at a temperature of 40° C. for 12 hours.

To 100 parts of the toner particles obtained as above were added 1 part of silica microparticles, and the particles were mixed by using a high-speed agitator (manufactured by Nippon Coke & Engineering Co., Ltd., product name: FM Mixer), whereby the toner T-1 was produced. The silica microparticles used were 0.7 parts of hydrophobicized silica microparticles having a number average primary particle size of 7 nm and hydrophobicized silica microparticles having a number average primary particle size of 50 nm.

Production Examples of Toners T-2 to T-10

Toners T-2 to T-10 were produced in the same manner as in the production example of the toner T-1, except that the type or added amount of the wax were changed in the production example of the toner T-1 as shown in Table 5. The properties of the obtained respective toners are shown in Table 5.

Production Example of Toner T-11

A toner T-11 was produced in the same manner as in the production example of the toner T-1, except that the wax A-1 was changed to a wax A-7 (paraffin wax HNP-51, melting point 78° C., manufactured by Nippon Seiro Co., Ltd.) in the production example of the toner T-1. The properties of the obtained respective toners are shown in Table 5.

TABLE 5

| | Toner No | | | | | | | | | | |
|---|---|---|---|---|---|---|---|---|---|---|---|
| | T-1 | T-2 | T-3 | T-4 | T-5 | T-6 | T-7 | T-8 | T-9 | T-10 | T-11 |
| | Wax | | | | | | | | | | |
| | A-1 | A-2 | A-3 | A-4 | A-5 | A-6 | A-1 | A-1 | A-1 | A-1 | A-7 |
| Added amount of wax (parts) | 20 | 20 | 20 | 20 | 20 | 20 | 10 | 30 | 5 | 35 | 20 |
| Melting temperature Tm by ½ method (° C.) | 125 | 124 | 125 | 125 | 124 | 125 | 124 | 124 | 125 | 125 | 125 |
| Glass transition temperature Tg (° C.) | 51 | 51 | 51 | 50 | 52 | 51 | 53 | 50 | 54 | 49 | 55 |

TABLE 5-continued

| | Toner No | | | | | | | | | | |
|---|---|---|---|---|---|---|---|---|---|---|---|
| | T-1 | T-2 | T-3 | T-4 | T-5 | T-6 | T-7 | T-8 | T-9 | T-10 | T-11 |
| | | | | | Wax | | | | | | |
| | A-1 | A-2 | A-3 | A-4 | A-5 | A-6 | A-1 | A-1 | A-1 | A-1 | A-7 |
| Number average molecular weight Mn | 8700 | 8600 | 8500 | 8750 | 8600 | 8500 | 8800 | 8700 | 8800 | 8600 | 8500 |
| Weight average molecular weight Mw | 243600 | 236500 | 248500 | 2535400 | 245600 | 248600 | 235400 | 275600 | 2256400 | 2856300 | 246800 |
| Molecular weight distribution Mw/Mn | 28 | 28 | 29 | 290 | 29 | 29 | 27 | 32 | 256 | 332 | 29 |

Example 1

As the image forming apparatus, a modified monochrome laser printer (product name: HL-5200, manufactured by Brother Industries, Ltd.) was used. A high-voltage power supply control system (product name: Model615-3, manufactured by Trek Japan) was used as a power supply for supplying power for a corona charger from the outside of the printer. An amount of current flowing through a corona wire of the corona charger was adjusted to 500 μA.

A toner in a toner cartridge of this printer was removed, and instead, the toner T-1 was filled therein. A photosensitive member of a drum unit was removed, and instead, the photosensitive member 1 was set therein.

This image forming apparatus was left to stand in an environment of temperature 30° C./humidity 80% RH for 24 hours or more, and the following evaluation was performed.

(Evaluation of Image Flow)

An image formed at an image print coverage rate of 3% was output on 30,000 sheets of A4-sized paper. After that, a power supply to an evaluation device was stopped and suspended for 3 days.

After a three-day suspension, the power supply to the evaluation device was started again, and a character image (E-letter image) in which matrix images and the letters "E" of the alphabet (font type: Times, font size: 6 points) were repeated was output on A4-sized paper. The obtained image was evaluated for its effect of suppressing image defects in accordance with the following evaluation ranks. The higher the rank number, the better, and ranks 5, 4 and 3 were judged to be levels at which the effect of suppressing image defects was obtained. On the other hand, ranks 1 and 2 were judged to be levels at which the effect of suppressing image defects was not obtained.

Rank 5: No image defects are observed in both the matrix image and the E-letter image.

Rank 4: Although the matrix image is partially blurred, no image defects are observed in the E-letter image.

Rank 3: The matrix image is partially blurred, and the E-letter image becomes partially light.

Rank 2: The matrix image partially disappears, and the E-letter image is an evenly thin image.

Rank 1: The matrix image totally disappears, and the E-letter image is an evenly thin image.

(Evaluation of Wear Resistance)

Regarding a film thickness on a surface of a central portion of the photosensitive member 1 used in the image flow evaluation, an amount of decrease (amount of wearing) from the initial stage was measured. At that time, the film thickness was measured using a film thickness meter Fischer MMS Eddy Current Probe EAW3.3, manufactured by Fischer Instruments K.K. The amount of decrease in the film thickness of the photosensitive layer was evaluated with a value obtained by converting the amount of decrease after outputting 30,000 sheets of images per 1,000 sheets of images.

(Evaluation of Low-Temperature Fixability)

The image forming apparatus was modified so that a fixing temperature of a fixing device of the image forming apparatus could be set arbitrarily. Using this device, the fixing temperature of the fixing device was adjusted every 5° C. in a range of 180° C. to 230° C., and a solid black image formed at an image print coverage rate of 100% was output using FOX RIVER BOND paper (110 g/m$^2$), which was rough paper. At this time, it was visually evaluated whether or not there was a white patch portion in the solid black image, and the low-temperature fixability was evaluated by the lowest temperature at which the white patch portion was generated.

Rank 5: White patch is generated at less than 190° C.

Rank 4: White patch is generated at 190° C. or more and less than 200° C.

Rank 3: White patch is generated at 200° C. or more and less than 210° C.

Rank 2: White patch is generated at 210° C. or more and less than 220° C.

Rank 1: White patch is generated at 220° C. or more

The results are shown in Table 6.

Examples 2 to 13

An image forming apparatus was prepared in the same manner as in Example 1 except that the photosensitive member D-1 and the toner T-1 of Example 1 were changed as shown in Table 6, and the evaluation was performed in the same manner as in Example 1. The results are shown in Table 6.

TABLE 6

| | Photosensitive member | Toner | I Silica/ binder resin (A) (%) | II Formula (3)/ binder resin (B) (%) | I/II | Image flow | Wear resistance amount of wearing (μm) | Low-temperature fixability |
|---|---|---|---|---|---|---|---|---|
| Example 1 | D-1 | T-1 | 1 | 20 | 0.050 | 5 | 1.2 | 5 |
| Example 2 | D-1 | T-7 | 1 | 10 | 0.100 | 5 | 1.2 | 5 |
| Example 3 | D-1 | T-8 | 1 | 30 | 0.033 | 5 | 1.2 | 5 |
| Example 4 | D-1 | T-9 | 1 | 5 | 0.200 | 5 | 1.2 | 4 |
| Example 5 | D-1 | T-10 | 1 | 35 | 0.029 | 5 | 1.2 | 4 |
| Example 6 | D-14 | T-1 | 0.5 | 20 | 0.025 | 5 | 1.3 | 5 |
| Example 7 | D-15 | T-1 | 5 | 20 | 0.250 | 5 | 1.1 | 5 |
| Example 8 | D-16 | T-1 | 10 | 20 | 0.500 | 5 | 1.1 | 5 |
| Example 9 | D-17 | T-1 | 15 | 20 | 0.750 | 4 | 1.1 | 5 |
| Example 10 | D-18 | T-1 | 20 | 20 | 1.000 | 3 | 1.1 | 5 |
| Example 11 | D-19 | T-1 | 0.1 | 20 | 0.005 | 3 | 1.4 | 5 |
| Example 12 | D-1 | T-10 | 0.5 | 35 | 0.014 | 5 | 1.3 | 4 |
| Example 13 | D-1 | T-7 | 0.1 | 10 | 0.010 | 4 | 1.4 | 5 |

Examples 14 to 45, Comparative Examples 1 to 3

An image forming apparatus was prepared in the same manner as in Example 1 except that the photosensitive member D-1 and the toner T-1 of Example 1 were changed as shown in Table 7, and the evaluation was performed in the same manner as in Example 1. The results are shown in Table 7.

TABLE 7

| | Photosensitive member | Toner | Image flow | Wear resistance amount of wearing (μm) | Low-temperature fixability |
|---|---|---|---|---|---|
| Example 14 | D-2 | T-1 | 5 | 1.2 | 5 |
| Example 15 | D-3 | T-1 | 5 | 1.4 | 5 |
| Example 16 | D-4 | T-1 | 5 | 1.5 | 5 |
| Example 17 | D-5 | T-1 | 5 | 1.6 | 5 |
| Example 18 | D-6 | T-1 | 5 | 1.6 | 5 |
| Example 19 | D-7 | T-1 | 5 | 1.7 | 5 |
| Example 20 | D-8 | T-1 | 5 | 1.3 | 5 |
| Example 21 | D-9 | T-1 | 5 | 1.3 | 5 |
| Example 22 | D-10 | T-1 | 5 | 1.4 | 5 |
| Example 23 | D-11 | T-1 | 5 | 1.4 | 5 |
| Example 24 | D-12 | T-1 | 5 | 1.5 | 5 |
| Example 25 | D-13 | T-1 | 5 | 1.4 | 5 |
| Example 26 | D-20 | T-1 | 5 | 1.2 | 5 |
| Example 27 | D-21 | T-1 | 5 | 1.2 | 5 |
| Example 28 | D-22 | T-1 | 3 | 1.3 | 5 |
| Example 29 | D-23 | T-1 | 3 | 1.4 | 5 |
| Example 30 | D-24 | T-1 | 5 | 1.2 | 5 |
| Example 31 | D-25 | T-1 | 5 | 1.3 | 5 |
| Example 32 | D-26 | T-1 | 5 | 1.3 | 5 |
| Example 33 | D-27 | T-1 | 5 | 1.4 | 5 |
| Example 34 | D-28 | T-1 | 5 | 1.3 | 5 |
| Example 35 | D-29 | T-1 | 5 | 1.5 | 5 |
| Example 36 | D-30 | T-1 | 5 | 1.4 | 5 |
| Example 37 | D-31 | T-1 | 4 | 1.3 | 5 |
| Example 38 | D-32 | T-1 | 5 | 1.2 | 5 |
| Example 39 | D-33 | T-1 | 5 | 1.4 | 4 |
| Example 40 | D-34 | T-1 | 5 | 1.4 | 5 |
| Example 41 | D-1 | T-2 | 4 | 1.2 | 5 |
| Example 42 | D-1 | T-3 | 5 | 1.2 | 5 |
| Example 43 | D-1 | T-4 | 5 | 1.2 | 4 |
| Example 44 | D-1 | T-5 | 5 | 1.2 | 5 |
| Example 45 | D-1 | T-6 | 5 | 1.2 | 4 |
| Comparative Example 1 | D-35 | T-1 | 2 | 1.7 | 5 |
| Comparative Example 2 | D-1 | T-11 | 5 | 1.1 | 1 |
| Comparative Example 3 | D-36 | T-1 | 5 | 2.5 | 1 |

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-217519, filed Nov. 29, 2019, which is hereby incorporated by reference herein in its entirety.

What is claimed is:

1. An image forming apparatus comprising:
an electrophotographic photosensitive member comprising a support and a photosensitive layer;
a charging unit that performs charging to form an electrostatic image on an outer surface of the electrophotographic photosensitive member;
an exposing unit that applies exposure light that forms the electrostatic image to the outer surface of the electrophotographic photosensitive member;
a developing unit that supplies a toner to the electrostatic image to form a toner image; and a transfer unit that transfers the toner image on a transfer medium,
wherein a surface layer of the electrophotographic photosensitive member comprises:
a binder resin (A), and
silica particles, and
the binder resin (A) has a structure represented by the following formula (1) and a structure represented by the following formula (2):

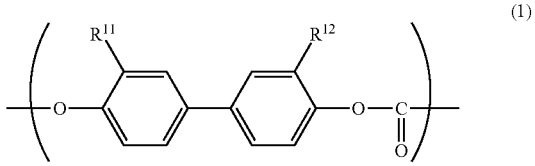

wherein $R^{11}$ and $R^{12}$ each independently represent a hydrogen atom or a methyl group,

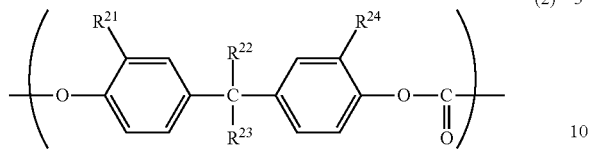

(2)

wherein $R^{21}$ and $R^{24}$ each independently represent a hydrogen atom or a methyl group, $R^{22}$ and $R^{23}$ each independently represent a hydrogen atom, a methyl group, an ethyl group or a phenyl group, or $R^{22}$ and $R^{23}$ combine with each other to form a cycloalkylidene group, the toner has toner particle comprising:
  a binder resin (B), and
  a wax, and the wax comprises a monoester compound represented by the following formula (3):

$$R^{31}\text{—COO—}R^{32} \quad (3)$$

wherein $R^{31}$ and $R^{32}$ each independently represent an alkyl group having 10 to 30 carbon atoms.

2. The image forming apparatus according to claim 1, wherein the silica particles are surface-treated silica particles.

3. The image forming apparatus according to claim 1, wherein when a ratio of a value of a content ratio of the silica particles, based on mass, to the binder resin (A) in the surface layer is defined as "a", and a value of a content ratio of a monoester compound represented by the general formula (3), based on mass, to the binder resin (B) in the toner particle is defined as "b", a:b is in a range of 0.01:1 to 0.5:1.

4. The image forming apparatus according to claim 1, wherein
  $R^{21}$ and $R^{24}$ in the general formula (2) are hydrogen atoms,
  $R^{22}$ and $R^{23}$ are bonded to each other to form a cycloalkylidene group, and,
  a molar ratio between the structure represented by the general formula (1) and the structure represented by the general formula (2) in the binder resin (A) is in a range of 1:3 to 7:3.

5. The image forming apparatus according to claim 1, wherein a content of the silica particles in the surface layer is 0.5 to 15 parts by mass with respect to 100 parts by mass of the binder resin (A).

6. The image forming apparatus according to claim 1, wherein the silica particles have a particle size of 10 to 300 nm.

7. The image forming apparatus according to claim 1,
  wherein the photosensitive layer comprises an electron-transporting substance, and
  the electron-transporting substance comprises at least one compound selected from the group consisting of compounds represented by the following formulas (4) to (12):

(4)

(5)

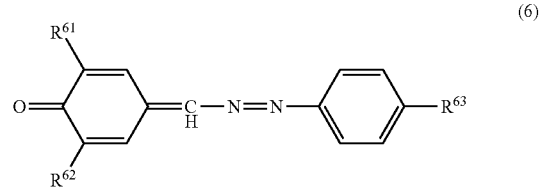

(6)

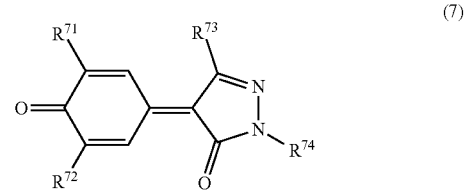

(7)

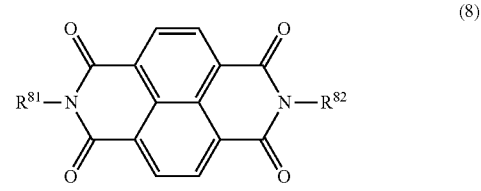

(8)

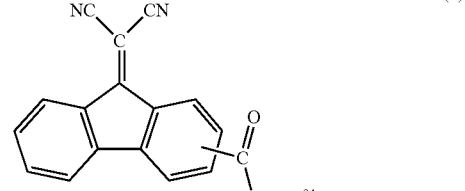

(9)

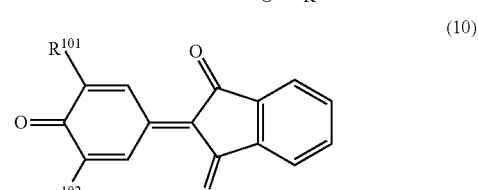

(10)

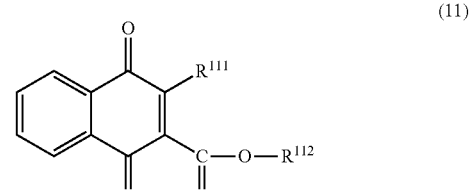

(11)

-continued

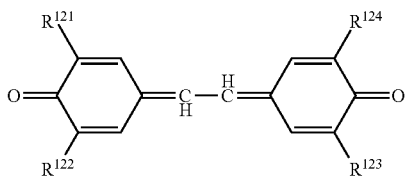
(12)

wherein $R^{41}$ to $R^{44}$, $R^{51}$, $R^{52}$, $R^{61}$, $R^{62}$, $R^{71}$ to $R^{73}$, $R^{101}$, $R^{102}$, and $R^{121}$ to $R^{124}$ each independently represent a hydrogen atom or an alkyl group having 1 to 6 carbon atoms, $R^{63}$ represents a hydrogen atom, a halogen group, or an alkyl group having 1 to 6 carbon atoms, $R^{74}$, $R^{31}$, and $R^{82}$ each independently represent an alkyl group having 1 to 6 carbon atoms, a halogen group, or a phenyl group which optionally has an alkyl group having 1 to 6 carbon atoms, $R^{91}$ represents an alkyl group having 1 to 6 carbon atoms which optionally has a hydrogen atom or a halogen atom, and $R^{111}$ and $R^{112}$ each independently represent an alkyl group having 1 to 6 carbon atoms which optionally has a halogen group, a phenyl group which optionally has a halogen group or an alkyl group having 1 to 6 carbon atoms, or a benzyl group which optionally has a halogen group or an alkyl group having 1 to 6 carbon atoms.

8. The image forming apparatus according to claim 1, wherein the photosensitive layer is a monolayer type photosensitive layer comprising:
charge-generating substance,
a hole-transporting substance, and
an electron-transporting substance, and
the monolayer type photosensitive layer is the surface layer.

9. The image forming apparatus according to claim 1, wherein the monoester compound represented by the formula (3) has a carbon number per molecule of 36 to 44.

10. The image forming apparatus according to claim 1, wherein the monoester compound represented by the formula (3) has melting point of 60 to 75° C.

11. The image forming apparatus according to claim 1, wherein the monoester compound represented by the formula (3) has acid value of 1.0 mgKOH/g or less.

12. The image forming apparatus according to claim 1, wherein the toner particle comprises the monoester compound represented by the formula (3) in a content of 10 to 30 parts by mass with respect to 100 parts by mass of the binder resin (B).

13. The image forming apparatus according to claim 1, wherein the transfer medium is paper.

14. An image forming method comprising: forming an electrostatic image on an outer surface of an electrophotographic photosensitive member comprising a support and a photosensitive layer; supplying a toner to the electrostatic image to form a toner image; and transferring the toner image on a transfer medium, wherein a surface layer of the electrophotographic photosensitive member comprises: a binder resin (A), and silica particles, and the binder resin (A) has a structure represented by a formula (1) and a structure represented by a formula (2):

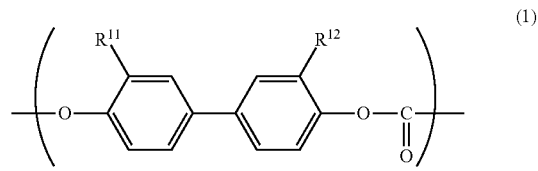
(1)

wherein $R^{11}$ and $R^{12}$ each independently represent a hydrogen atom or a methyl group,

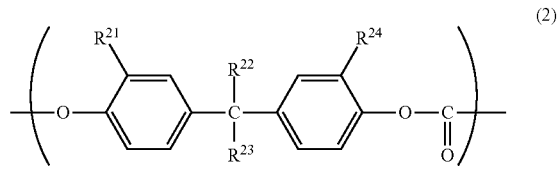
(2)

wherein $R^{21}$ and $R^{24}$ each independently represent a hydrogen atom or a methyl group, $R^{22}$ and $R^{23}$ each independently represent a hydrogen atom, a methyl group, an ethyl group or a phenyl group, or $R^{22}$ and $R^{23}$ combine with each other to form a cycloalkylidene group, the toner has toner particle comprising: a binder resin (B), and a wax, and the wax comprises a monoester compound represented by the following formula (3):

$$R^{31}\text{—COO—}R^{32} \quad (3)$$

wherein $R^{31}$ and $R^{32}$ each independently represent an alkyl group having 10 to 30 carbon atoms.

* * * * *